United States Patent
Emoto et al.

(10) Patent No.: US 10,720,320 B2
(45) Date of Patent: Jul. 21, 2020

(54) SUBSTRATE PROCESSING METHOD AND SUBSTRATE PROCESSING DEVICE

(71) Applicant: SCREEN Holdings Co., Ltd., Kyoto (JP)

(72) Inventors: Tetsuya Emoto, Kyoto (JP); Atsuro Eitoku, Kyoto (JP); Tomomi Iwata, Kyoto (JP); Akihiko Taki, Kyoto (JP)

(73) Assignee: SCREEN Holdings Co., Ltd. (JP)

( * ) Notice: Subject to any disclaimer, the term of this patent is extended or adjusted under 35 U.S.C. 154(b) by 155 days.

(21) Appl. No.: 15/761,310

(22) PCT Filed: Sep. 13, 2016

(86) PCT No.: PCT/JP2016/076993
§ 371 (c)(1),
(2) Date: Mar. 19, 2018

(87) PCT Pub. No.: WO2017/056971
PCT Pub. Date: Apr. 6, 2017

(65) Prior Publication Data
US 2018/0269056 A1    Sep. 20, 2018

(30) Foreign Application Priority Data
Sep. 29, 2015  (JP) .................................. 2015-192156

(51) Int. Cl.
*H01L 21/02* (2006.01)
*H01L 21/67* (2006.01)

(52) U.S. Cl.
CPC .. *H01L 21/02057* (2013.01); *H01L 21/67028* (2013.01); *H01L 21/67051* (2013.01)

(58) Field of Classification Search
CPC ......... H01L 21/02052; H01L 21/02057; H01L 21/67028; H01L 21/67051
See application file for complete search history.

(56) References Cited

U.S. PATENT DOCUMENTS

| 2012/0186607 A1* | 7/2012 | Higashijima | ..... H01L 21/67051 134/30 |
| 2014/0261570 A1 | 9/2014 | Orii et al. | ........................ 134/31 |
| 2015/0083167 A1 | 3/2015 | Yoshizumi et al. | ............ 134/26 |

FOREIGN PATENT DOCUMENTS

| JP | 2005-123218 A | 5/2005 |
| JP | 2014-110404 A | 6/2014 |

(Continued)

OTHER PUBLICATIONS

International Preliminary Report on Patentability (Chapter I) with Notification from the International Bureau Form PCT/IB/326 for International Application No. PCT/JP2016/076993 dated Apr. 12, 2018.

(Continued)

*Primary Examiner* — Mikhail Kornakov
*Assistant Examiner* — Natasha N Campbell
(74) *Attorney, Agent, or Firm* — Ostrolenk Farber LLP

(57) ABSTRACT

A substrate processing method including a center portion discharging step of discharging a low-surface-tension liquid from a first low-surface-tension liquid nozzle disposed above a substrate toward the center portion of an upper surface, an inert gas supplying step of supplying inert gas to above the substrate in parallel with the center portion discharging step in order to form a gas flow flowing along the upper surface, and a peripheral edge portion discharging and supplying step of discharging the low-surface-tension liquid from a second low-surface-tension liquid nozzle disposed above the substrate toward a peripheral edge portion of the upper surface in parallel with the center portion discharging step and the inert gas supplying step.

8 Claims, 16 Drawing Sheets

(56) References Cited

FOREIGN PATENT DOCUMENTS

| | | |
|---|---|---|
| JP | 2014-199917 A | 10/2014 |
| JP | 2015-019016 A | 1/2015 |
| JP | 2015-088737 A | 5/2015 |

OTHER PUBLICATIONS

English translation of the International Preliminary Report on Patentability (Chapter I) with Notification from the International Bureau Form PCT/IB/338 International Application No. PCT/JP2016/076993 dated Apr. 12, 2018.
International Search Report dated Oct. 25, 2016 in corresponding PCT International Application No. PCT/JP2016/076993.
Written Opinion dated Oct. 25, 2016 in corresponding PCT International Application No. PCT/JP2016/076993.

* cited by examiner

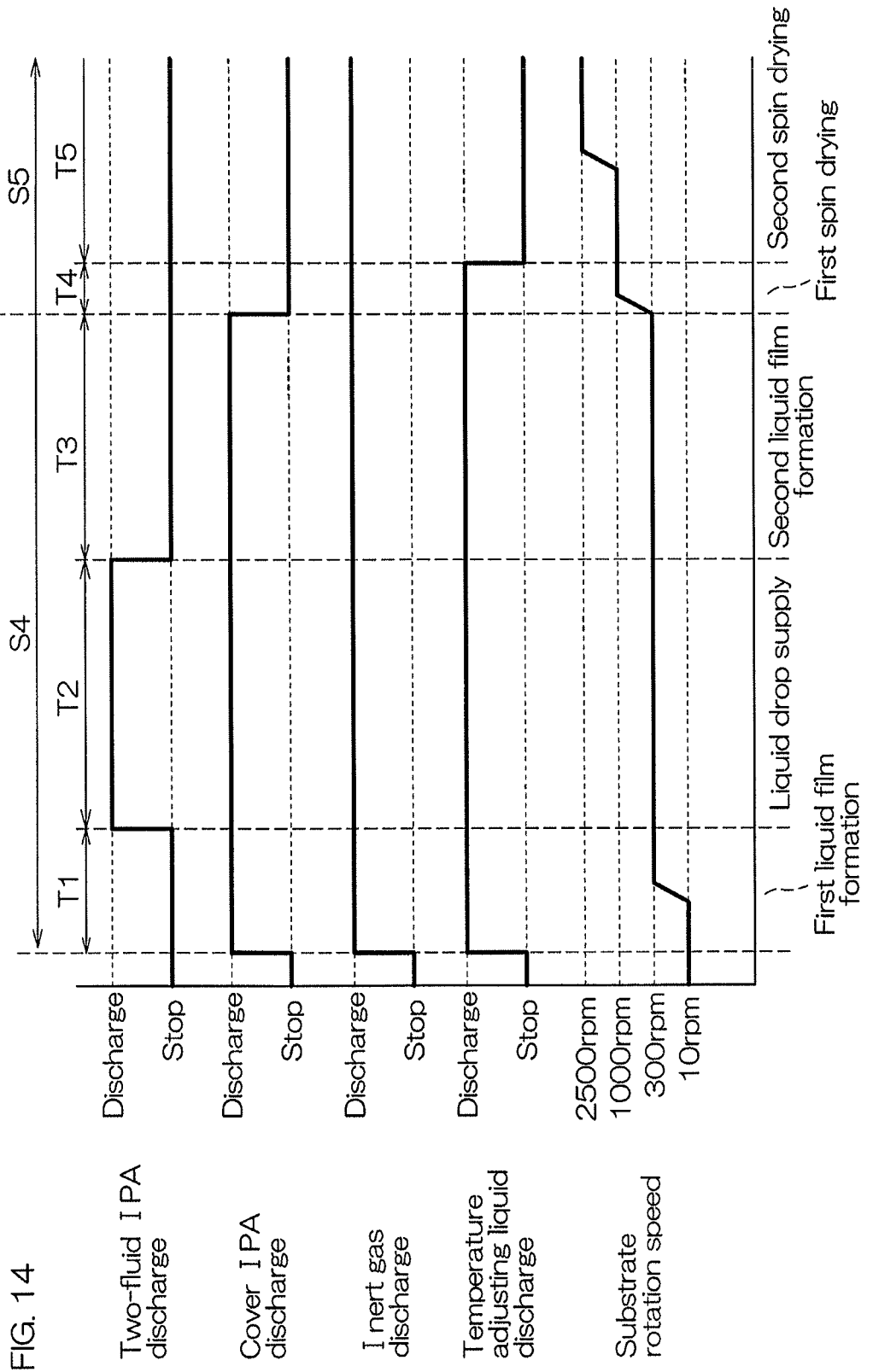

FIG. 15A
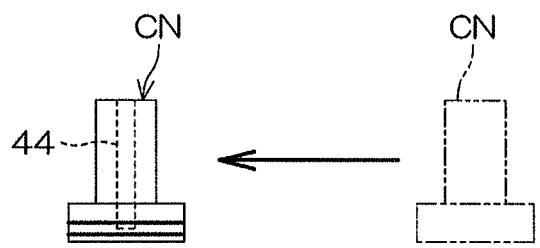
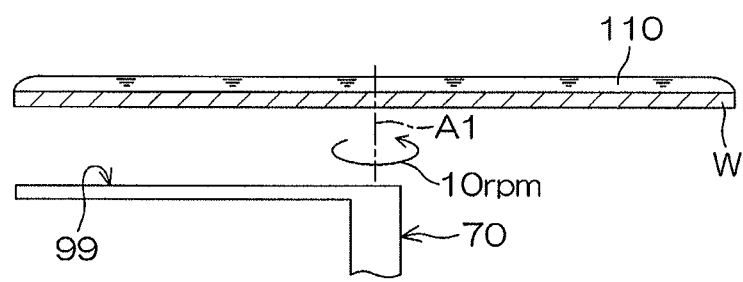
FIG. 15B
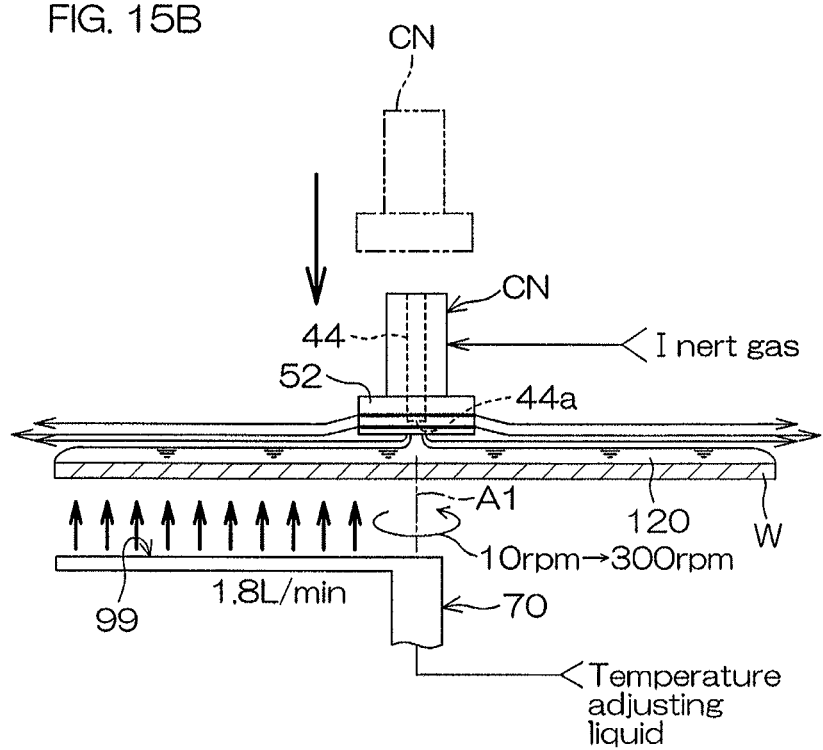

SUBSTRATE PROCESSING METHOD AND SUBSTRATE PROCESSING DEVICE

CROSS-REFERENCE TO RELATED APPLICATIONS

The present application is a 35 U.S.C. §§ 371 national phase conversion of PCT/JP2016/076993, filed Sep. 13, 2016, which claims priority to Japanese Patent Application No. 2015-192156, filed Sep. 29, 2015, the contents of both of which are incorporated herein by reference. The PCT International Application was published in the Japanese language.

TECHNICAL FIELD

The present invention relates to a substrate processing method and a substrate processing apparatus which process a surface of a substrate using a low-surface-tension liquid. Examples of substrates to be processed include semiconductor wafers, substrates for a liquid crystal display, substrates for plasma displays, substrates for FEDs (Field Emission Display), substrates for optical disks, substrates for magnetic disks, substrates for magneto-optical disks, substrates for photomasks, ceramic substrates, and substrates for solar cells.

BACKGROUND ART

In a manufacturing process of a semiconductor device, a surface of a substrate such as a semiconductor wafer is processed by using a processing liquid. A single-substrate-processing apparatus processing semiconductor wafers one by one comprises a spin chuck rotating a substrate while holding the substrate horizontally, and a nozzle for supplying the processing liquid to a surface of the substrate rotated by the spin chuck.

In a typical substrate processing step, a chemical liquid is supplied to a substrate held by a spin chuck. Thereafter, a rinsing liquid is supplied to the substrate, whereby the chemical liquid on the substrate is replaced by the rinsing liquid. Thereafter, a spin drying step for eliminating the rinsing liquid on the substrate is executed. In the spin drying step, the substrate is rotated at a high speed, whereby the rinsing liquid adhered on the substrate is flicked off and removed (dried). A usual rinsing liquid is deionized water.

When a fine pattern is formed on a surface of a substrate, there may be a problem that a rinsing liquid entering an inside of the pattern cannot be removed in a spin drying step, whereby insufficient drying may occur. Therefore, there has been proposed an approach of drying a surface of a substrate by supplying a surface of a substrate after processing by using a rinsing liquid with an organic solvent such as isopropyl alcohol (IPA) to replace a rinsing liquid entering a clearance of a pattern of the surface of the substrate with the organic solvent.

As shown in FIG. 18, in a spin drying step where a substrate is dried by rotating the substrate at a high speed, a liquid surface (boundary surface between air and a liquid) is formed in a pattern. In this case, a surface tension arises at a contact position between the liquid surface and the pattern. This surface tension is one of causes which collapse the pattern.

As described in following Patent document 1, when a liquid of an organic solvent is supplied to a surface of a substrate after a rinsing treatment and before a spin drying step, the liquid of the organic solvent enters a pattern. A surface tension of the organic solvent is lower than that of water which is a typical rinsing liquid. Therefore, a problem of a pattern collapsing due to a surface tension is relieved.

Further, a substrate processing apparatus described in Patent document 1 includes a solvent nozzle opposed to an upper surface center portion of a substrate held by a spin chuck and discharging IPA to the upper surface center portion of the substrate, and a center gas nozzle holding and encompassing the solvent nozzle and discharging inert gas above the substrate held by the spin chuck.

After the rinsing treatment, inert gas is discharged from the center gas nozzle. Thus, a gas flow of nitrogen gas flowing radially along a fluid film of pure water covering the entire upper surface of the substrate is formed. Further, in parallel with discharging of the inert gas from the center gas nozzle, IPA is discharged from the solvent nozzle toward the upper surface center portion of the substrate in a rotated state.

PRIOR ART DOCUMENT

Patent Document

Patent document 1: Japanese Unexamined Patent Publication No. 2014-110404

SUMMARY OF THE INVENTION

Subject to be Solved by the Invention

In the approach of Patent document 1, since a low-surface-tension liquid (IPA) is discharged from the solvent nozzle opposedly disposed to the upper surface center portion of a substrate, the low-surface-tension liquid discharged from the solvent nozzle is supplied to the upper surface center portion of the substrate. Thus, there may be a problem that a sufficient amount of the low-surface-tension liquid does not reach an upper surface peripheral edge portion of the substrate and a rinsing liquid adhered on the upper surface peripheral edge portion of the substrate is not favorably replaced with the low-surface-tension liquid. That is, there may be a problem that a replacement performance to the low-surface-tension liquid on the upper surface peripheral edge portion of the substrate is low. If the replacement performance on the upper surface peripheral edge portion of the substrate is low in a replacing step, there may be a problem that a pattern collapses on the upper surface peripheral edge portion of the substrate in a spin drying step thereafter executed.

Accordingly, a purpose of the present invention is to provide a substrate processing method and a substrate processing apparatus which can more effectively suppress a collapse of a pattern on an upper surface peripheral edge portion of a substrate.

Solution to Solve the Problem

The invention provides a substrate processing method of processing a substrate held horizontally by using a processing liquid, including a replacing step of replacing the processing liquid adhered on an upper surface of the substrate with a low-surface-tension liquid whose surface tension is lower than that of the processing liquid, wherein the replacing step executes a center portion discharging step of discharging the low-surface-tension liquid from a first low-surface-tension liquid nozzle disposed above the substrate toward the center portion of the upper surface, an inert gas supplying step of supplying inert gas to above the substrate in parallel with the center portion discharging step in order to form a gas flow flowing along the upper surface, and a peripheral edge portion discharging and supplying step of discharging the low-surface-tension liquid from a second low-surface-tension liquid nozzle disposed above the substrate toward a peripheral edge portion of the upper surface in parallel with the center portion discharging step and the inert gas supplying step.

While the numbers and the like in parentheses present corresponding components and the like in embodiments described later, this does not mean that the present invention should be limited to these embodiments. This is true through this specification.

According to this method, in the replacing step, discharging of the low-surface-tension liquid from the first low-surface-tension liquid nozzle toward the upper surface center portion of the substrate, discharging of the low-surface-tension liquid from the second low-surface-tension liquid nozzle toward the upper surface peripheral edge portion of the substrate and supplying of the inert gas to above the substrate are executed in parallel with one another.

Since discharging of the low-surface-tension liquid to the upper surface peripheral edge portion of the substrate is executed in parallel with discharging of the low-surface-tension liquid to the upper surface center portion of the substrate, a sufficient amount of the low-surface-tension liquid can be allowed to reach not only the upper surface center portion of the substrate but also the upper surface peripheral edge portion of the substrate.

Further, the gas flow of the inert gas flowing along the upper surface of the substrate is formed by supplying the inert gas to above the substrate in parallel with supplying of the low-surface-tension liquid to the upper surface of the substrate. A humidity of a space on the upper surface of the substrate can be kept low by this gas flow of the inert gas. Assuming that the low-surface-tension liquid is supplied to the upper surface of the substrate in a state where the humidity of the space on the upper surface of the substrate is high, the low-surface-tension liquid supplied to the upper surface of the substrate may blend into moisture contained in atmosphere of the space, thus an amount of the low-surface-tension liquid present on the upper surface of the substrate may be decreased, and as a result, the replacement performance to the low-surface-tension liquid may be lowered. Contrary to this, in the present invention, blending of the low-surface-tension liquid supplied to the substrate into moisture in atmosphere of the space on the upper surface of the substrate can be suppressed or prevented by keeping low the humidity of the space on the upper surface of the substrate in the replacing step. Thus, decrease of a liquid amount of the low-surface-tension liquid supplied to the upper surface of the substrate can be effectively suppressed or prevented.

Accordingly, since a sufficient liquid amount of the low-surface-tension liquid can be supplied to the upper surface peripheral edge portion of the substrate, and at the same time, decrease of the low-surface-tension liquid supplied to the upper surface peripheral edge portion of the substrate can be effectively suppressed or prevented, the replacement performance to the low-surface-tension liquid on the upper surface peripheral edge portion of the substrate can be tried to be increased. Thus, a collapse of a pattern on the upper surface peripheral edge portion of the substrate can be more effectively suppressed.

In one embodiment of the invention, the peripheral edge portion discharging step includes a liquid drop discharging step of discharging a liquid drop of the low-surface-tension liquid to the peripheral edge portion of the upper surface.

According to this method, the low-surface-tension liquid supplied to the upper surface peripheral edge portion of the substrate is liquid drops of the low-surface-tension liquid. Thus, a physical force is applied to a supply region of liquid drops of the low-surface-tension liquid on the upper surface peripheral edge portion of the substrate by collision of liquid drops of the low-surface-tension liquid. Thus, the replacement performance to the low-surface-tension liquid on the upper surface peripheral edge portion of the substrate can be tried to be further increased.

Further, the liquid drop discharging step may include a step of discharging a liquid drop of the low-surface-tension liquid generated by mixing the low-surface-tension liquid and gas.

According to this method, liquid drops of the low-surface-tension liquid can be generated by mixing the low-surface-tension liquid and gas. Thus, supplying of liquid drops of the low-surface-tension liquid to the upper surface of the substrate can be easily achieved.

Further, the liquid drop discharging step may include a step of spouting a liquid drop of the low-surface-tension liquid from a plurality of spouting ports.

According to this method, since gas is not blown toward the upper surface of the substrate in the liquid drop discharging step, disturbance of the gas flow of the inert gas flowing along the upper surface of the substrate can be suppressed or prevented when liquid drops of the low-surface-tension liquid are supplied to the upper surface of the substrate. As a result, the inert gas can reliably cover above the peripheral edge portion of the substrate. Thus, the humidity of the atmosphere above the peripheral edge portion of the substrate can be kept further lower.

Further, the method may further include a supply region moving step of moving on the upper surface a supply region of the liquid drop of the low-surface-tension liquid on the peripheral edge portion of the upper surface in parallel with the liquid drop discharging step.

According to this method, the supply region of liquid drops of the low-surface-tension liquid on the upper surface of the substrate is moved on the upper surface peripheral edge portion in the liquid drop discharging step. Thus, liquid drops of the low-surface-tension liquid spouted from the second low-surface-tension liquid nozzle can be supplied to an extensive range of the upper surface peripheral edge portion of the substrate. Consequently, the replacement performance to the low-surface-tension liquid can be increased in the extensive range of the upper surface peripheral edge portion of the substrate.

The invention provides a substrate processing apparatus for processing a substrate by using a processing liquid, including: a substrate holding unit holding the substrate horizontally, a first low-surface-tension liquid nozzle disposed above the substrate for discharging a low-surface-tension liquid whose surface tension is lower than that of the processing liquid toward a center portion of an upper surface of the substrate; a first low-surface-tension liquid supplying mechanism supplying the low-surface-tension liquid to the first low-surface-tension liquid nozzle; an inert gas supplying unit supplying inert gas to above the substrate, a second low-surface-tension liquid nozzle disposed above the substrate for discharging the low-surface-tension liquid toward a peripheral edge portion of the upper surface, a second low-surface-tension liquid supplying mechanism supplying the low-surface-tension liquid to the second low-surface-tension liquid nozzle; and a controller executing, by controlling the first and second low-surface-tension liquid supplying mechanisms and the inert gas supplying unit, a center portion discharging step of discharging the low-surface-tension liquid from the first low-surface-tension liquid nozzle toward the center portion of the upper surface, an inert gas supplying step of supplying inert gas to the above in parallel with the center portion discharging step in order to form a gas flow flowing along the upper surface, and a peripheral edge portion discharging and supplying step of discharging the low-surface-tension liquid from a second low-surface-tension liquid nozzle disposed above the substrate toward the peripheral edge portion of the upper surface in parallel with the center portion discharging step and the inert gas supplying step.

According to this configuration, in the replacing step, discharging of the low-surface-tension liquid from the first low-surface-tension liquid nozzle toward the upper surface center portion of the substrate, discharging of the low-surface-tension liquid from the second low-surface-tension liquid nozzle toward the upper surface peripheral edge portion of the substrate and supplying of the inert gas to above the substrate are executed in parallel with one another.

Since discharging of the low-surface-tension liquid to the upper surface peripheral edge portion of the substrate is executed in parallel with discharging of the low-surface-tension liquid to the upper surface center portion of the substrate, a sufficient amount of the low-surface-tension liquid can be allowed to reach not only the upper surface center portion of the substrate but also the upper surface peripheral edge portion of the substrate.

Further, the gas flow of the inert gas flowing along the upper surface of the substrate is formed by supplying the inert gas to above the substrate in parallel with supplying of the low-surface-tension liquid to the upper surface of the substrate. A humidity of a space on the upper surface of the substrate can be kept low by this gas flow of the inert gas. Assuming that the low-surface-tension liquid is supplied to the upper surface of the substrate in a state where the humidity of the space on the upper surface of the substrate is high, the low-surface-tension liquid supplied to the upper surface of the substrate may blend into moisture contained in atmosphere of the space, thus an amount of the low-surface-tension liquid present on the upper surface of the substrate may be decreased, and as a result, the replacement performance to the low-surface-tension liquid may be lowered. Contrary to this, in the present invention, blending of the low-surface-tension liquid supplied to the substrate into moisture in atmosphere of the space on the upper surface of the substrate can be suppressed or prevented by keeping low the humidity of the space on the upper surface of the substrate in the replacing step. Thus, decrease of a liquid amount of the low-surface-tension liquid supplied to the upper surface of the substrate can be effectively suppressed or prevented.

Accordingly, since a sufficient liquid amount of the low-surface-tension liquid can be supplied to the upper surface peripheral edge portion of the substrate, and at the same time, decrease of the low-surface-tension liquid supplied to the upper surface peripheral edge portion of the substrate can be effectively suppressed or prevented, the replacement performance to the low-surface-tension liquid on the upper surface peripheral edge portion of the substrate can be tried to be increased. Thus, a collapse of a pattern on the upper surface peripheral edge portion of the substrate can be more effectively suppressed.

In one embodiment of the invention, the inert gas supplying unit includes an inert gas nozzle forming the gas flow radially spreading from the center portion of the upper surface to the peripheral edge portion of the upper surface along the upper surface by discharging inert gas above the substrate, and the second low-surface-tension liquid nozzle is disposed above the peripheral edge portion of the substrate and above the gas flow.

According to this configuration, the inert gas discharged from the inert gas nozzle forms the gas flow radially spreading from the upper surface center portion to the upper surface peripheral edge portion of the substrate along the upper surface of the substrate. The second low-surface-tension liquid nozzle is disposed above this gas flow of the inert gas. Thus, it can be suppressed or prevented that the second low-surface-tension liquid nozzle disturbs the gas flow of the inert gas flowing from the upper surface center portion toward the upper surface peripheral edge portion of the substrate along the upper surface of the substrate. Thus, the humidity of the atmosphere above the peripheral edge portion of the substrate can be kept further lower.

The above-described or yet other objects, features and advantages in the present invention are revealed by the following descriptions of embodiments with reference to accompanied drawings.

BRIEF DESCRIPTION OF THE DRAWINGS

FIG. 14 is a timing chart for describing the replacing step and the spin drying step.

FIGS. 15A to 15B are illustrative sectional views for describing appearances of the replacing step.

DESCRIPTION OF EMBODIMENTS

Figure 1:
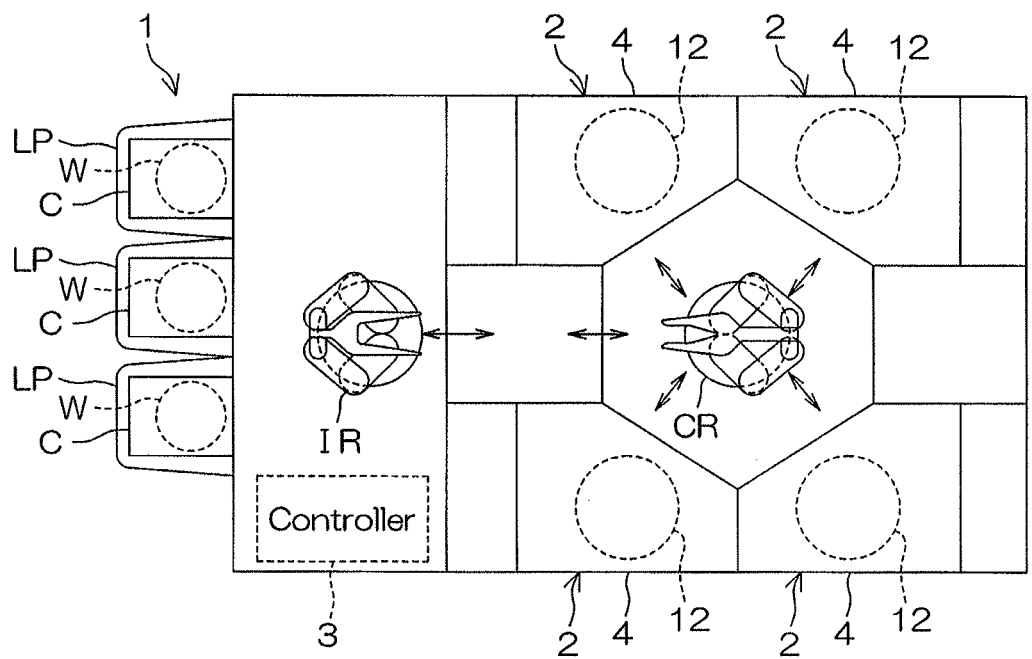
FIG. 1 is an illustrative plan view for describing a layout of an inside of a substrate processing apparatus for executing a substrate processing method according to one embodiment of the invention.

FIG. 1 is an illustrative plan view for describing a layout of an inside of a substrate processing apparatus for executing a substrate processing method according to one embodiment of the invention. The substrate processing apparatus 1 is a single-substrate-processing apparatus processing disk-shaped substrates W such as semiconductor wafers one by one by using an organic solvent or processing gas. The substrate processing apparatus 1 includes a plurality of processing units 2 processing a substrate W using the organic solvent, a load port LP where a carrier C accommodating a plurality of substrates W processed in the processing unit 2, transport robots IR and CR transporting a substrate W between the load port LP and the processing unit 2, and a controller 3 controlling the substrate processing apparatus 1. The transport robots IR transports the substrate W between the carrier C and the transport robot CR. The transport robot CR transports the substrate W between the load port LP and the processing unit 2. The plurality of processing units 2 have a similar configuration, for example.

Figure 2:
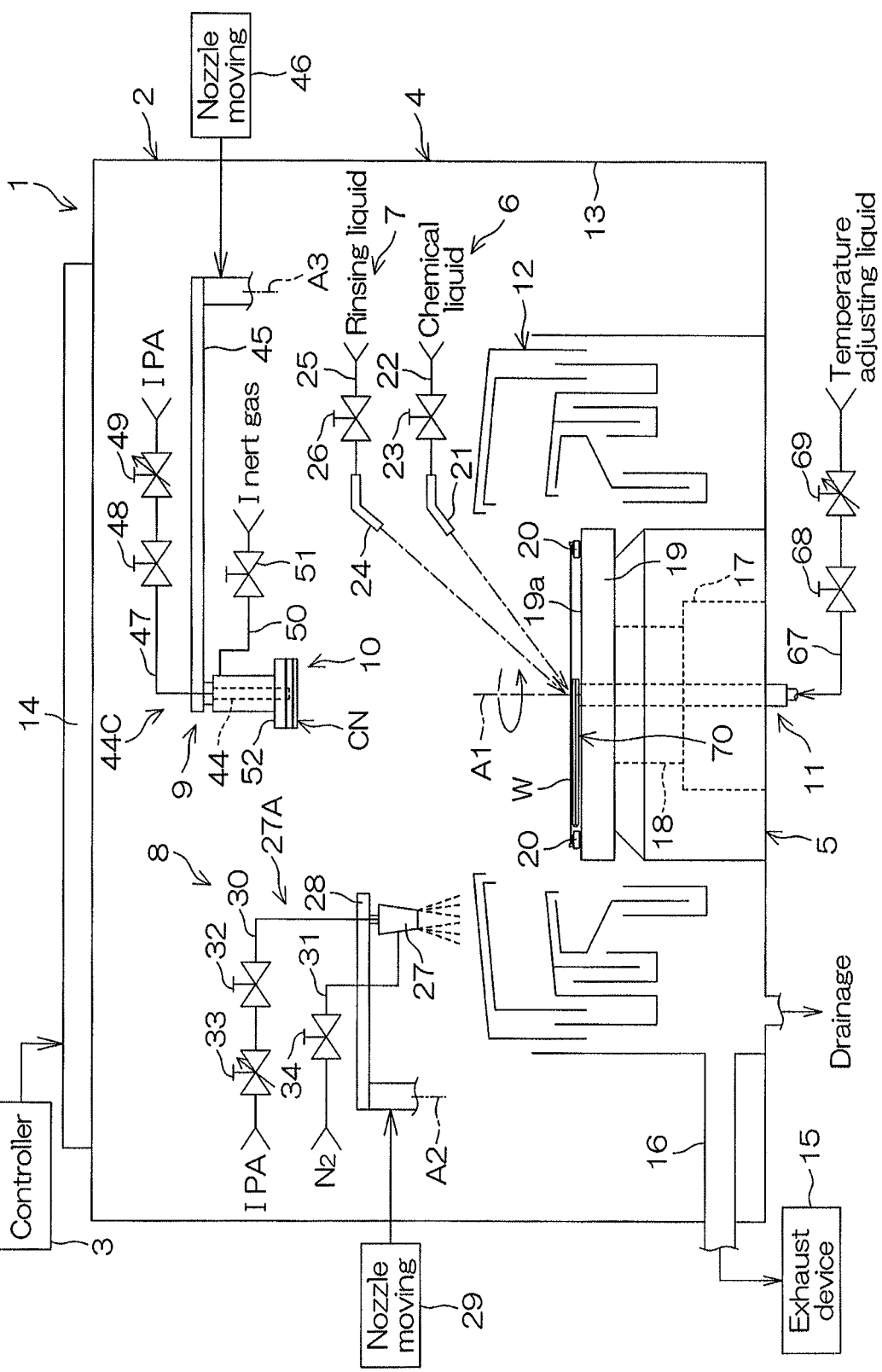
FIG. 2 is an illustrative sectional view for describing a configuration example of a processing unit provided in the substrate processing apparatus.

FIG. 2 is an illustrative sectional view for describing a configuration example of the processing unit 2.

The processing unit 2 includes a box-shaped processing chamber 4 having an inner space, a spin chuck 5 (substrate holding unit) holding one substrate W horizontally within the processing chamber 4 and rotating the substrate W about a vertical rotation axis line A1 passing a center of the substrate W, a chemical liquid supplying unit 6 for supplying a chemical liquid as an example of a processing liquid to an upper surface of the substrate W held by the spin chuck 5, a rinsing liquid supplying unit 7 for supplying a rinsing liquid as an example of a processing liquid to the upper surface of the substrate W held by the spin chuck 5, a first organic solvent supplying unit 8 for supplying IPA being an example of an organic solvent (low-surface-tension liquid) to the upper surface of the substrate W (front surface of the substrate W) held by the spin chuck 5, a second organic solvent supplying unit 9 for supplying IPA being an example of an organic solvent, an inert gas supplying unit 10 for supplying inert gas to above the substrate W held by the spin chuck 5, a lower surface supplying unit 11 supplying warm water as one example of a temperature adjusting liquid to a lower surface of the substrate W (rear surface of the substrate W) held by the spin chuck 5, and a cylindrical processing cup 12 surrounding the spin chuck 5.

The processing chamber 4 includes a box-shaped partition wall 13, an FFU (fan filter unit) 14 serving as a blowing unit blowing clean air from an upper portion of the partition wall 13 to an inside of the partition wall 13 (corresponding to an inside of the processing chamber 4), and an exhaust device 15 draining gas in the inside of the processing chamber 4 from a lower portion of the partition wall 13.

The FFU 14 is disposed above the partition wall 13 and is attached to a ceiling of the partition wall 13. The FFU 14 blows clean air from the ceiling of the partition wall 13 to the inside of the processing chamber 4. The exhaust device 15 is connected to a bottom portion of the processing cup 12 via an exhaust duct 16 connected to an inside of the processing cup 12 and sucks the inside of the processing cup 12 from the bottom portion of the processing cup 12. A downflow (descending flow) is formed by the FFU 14 and the exhaust device 15 in the inside of the processing chamber 4.

A clamping-type chuck holding horizontally the substrate W by clamping the substrate W in a horizontal direction is employed as the spin chuck 5. Specifically, the spin chuck 5 includes a spin motor 17, a spin shaft 18 integrated with a drive shaft of this spin motor 17, and a disk-shaped spin base 19 generally horizontally attached to an upper end of the spin shaft 18.

The spin base 19 includes a horizontal circular upper surface 19a having an outer diameter larger than an outer diameter (about 300 mm) of the substrate W. A plurality of (more than three; for example, four) clamping members 20 (see also FIG. 6) are disposed on a peripheral edge portion of the upper surface 19a. The plurality of clamping members 20 are disposed at intervals, for example, at regular intervals, on a circumference corresponding to an outer peripheral shape of the substrate W on an upper surface peripheral edge portion of the spin base 19.

The chemical liquid supplying unit 6 includes a chemical liquid nozzle 21. The chemical liquid nozzle 21 is, for example, a straight nozzle discharging a liquid in a state of a continuous flow and is fixedly disposed with its discharging port directed to an upper surface center portion of the substrate W above the spin chuck 5. Chemical liquid line 22 to which the chemical liquid from a chemical liquid supply source is connected to the chemical liquid nozzle 21. A chemical liquid valve 23 for switching discharge/supply stop of the chemical liquid from the chemical liquid nozzle 21 is interposed in a partway portion of the chemical liquid line 22. When the chemical liquid valve 23 is opened, the chemical liquid of the continuous flow supplied from the chemical liquid line 22 to the chemical liquid nozzle 21 is discharged from the discharging port provided on a lower end of the chemical liquid nozzle 21. Further, when the chemical liquid valve 23 is closed, discharging of the chemical liquid from the chemical liquid line 22 to the chemical liquid nozzle 21 is stopped.

A specific example of the chemical liquid is an etchant or a cleaning liquid. More specifically, the chemical liquid may be hydrofluoric acid, SC1 (ammonia-hydrogen peroxide mixture), SC2 (hydrochloric acid-hydrogen peroxide mixture), ammonium fluoride, buffered hydrogen fluoride (mixed liquid of hydrofluoric acid and ammonium fluoride), and the like.

The rinsing liquid supplying unit 7 includes a rinsing liquid nozzle 24. The rinsing liquid nozzle 24 is, for example, a straight nozzle discharging a liquid in a state of a continuous flow and is fixedly disposed with its discharging port directed to the upper surface center portion of the substrate W above the spin chuck 5. Rinsing liquid line 25 to which the rinsing liquid from a rinsing liquid supply source is connected to the rinsing liquid nozzle 24. A rinsing liquid valve 26 for switching discharge/supply stop of the rinsing liquid from the rinsing liquid nozzle 24 is interposed in a partway portion of the rinsing liquid line 25. When the rinsing liquid valve 26 is opened, the rinsing liquid of the continuous flow supplied from the rinsing liquid line 25 to the rinsing liquid nozzle 24 is discharged from the discharging port provided on a lower end of the rinsing liquid nozzle 24. Further, when the rinsing liquid valve 26 is closed, discharging of the rinsing liquid from the rinsing liquid line 25 to the rinsing liquid nozzle 24 is stopped. The rinsing liquid is, for example, deionized water (DIW), but is not limited to DIW and may be any of carbonated water, electrolytic ion water, hydrogen water, ozone water, and hydrochloric acid water of a dilute concentration (for example, around 10 ppm to 100 ppm).

The chemical liquid nozzle 21 and the rinsing liquid nozzle 24 are not necessarily disposed fixedly to the spin chuck 5 and may employ, for example, a form of a so-called scan nozzle which is attached above the spin chuck 5 to an arm swingable in a horizontal plane and scans by swinging of this arm a liquid contact position of a processing liquid (chemical liquid or rinsing liquid) on the upper surface of the substrate W.

The first organic solvent supplying unit 8 includes a first organic solvent nozzle (first low-surface-tension liquid nozzle) 27 for supplying liquid drops of the organic solvent to the upper surface of the substrate W held by the spin chuck 5, a first nozzle arm 28 to whose tip end portion the first organic solvent nozzle 27 is attached, and a nozzle moving unit 29 connected to the first nozzle arm 28 and swinging the first nozzle arm 28 about a first swinging axis line A2. When the nozzle moving unit 29 swings the first nozzle arm 28, the first organic solvent nozzle 27 is moved horizontally along a trajectory X1 (see FIG. 5) passing the upper surface center portion of the substrate W in plan view.

The first organic solvent nozzle 27 has a form of a two-fluid nozzle spouting minute liquid drops of the organic solvent. A first organic solvent supplying mechanism (first low-surface-tension liquid supplying mechanism) 27A supplying the organic solvent and gas to the first organic solvent nozzle 27 is connected to the first organic solvent nozzle 27. The first organic solvent supplying mechanism 27A includes first organic solvent line 30 supplying a liquid organic solvent (IPA) at room temperature from an organic solvent supply source to the first organic solvent nozzle 27, and gas line 31 supplying gas from a gas supply source to the first organic solvent nozzle 27.

A first organic solvent valve 32 switching discharge and supply stop of the organic solvent from the first organic solvent line 30 to the first organic solvent nozzle 27, and a first flow rate adjusting valve 33 for adjusting a flow rate of the organic solvent discharged from the first organic solvent nozzle 27 by adjusting an opening amount of the first organic solvent line 30 are interpose in the first organic solvent line 30. Although not shown, the first flow rate adjusting valve 33 includes a valve body in an inside of which a valve seat is provided, a valve element opening and closing the valve seat, and an actuator moving the valve element between an open position and a closed position. This is true of other flow rate adjusting valves.

A gas valve 34 switching discharge and supply stop of gas from the gas line 31 to the first organic solvent nozzle 27 is interposed in the gas line 31. While nitrogen gas ($N_2$) can be shown as one example of the gas supplied to the first organic solvent nozzle 27, inert gas other than nitrogen gas, such as dry air and clean air, can be employed.

Figure 3:
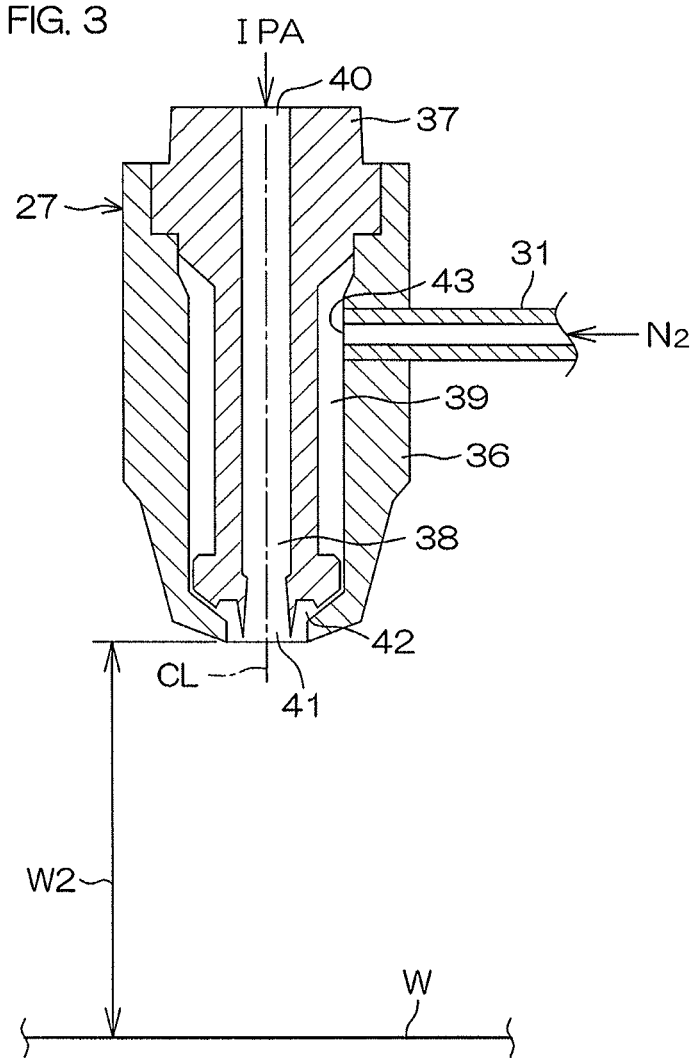
FIG. 3 is a sectional view illustratively showing a configuration of a first organic solvent nozzle provided in the substrate processing apparatus.

FIG. 3 is a sectional view illustratively showing a configuration of the first organic solvent nozzle 27.

As shown in FIG. 3, the first organic solvent nozzle 27 has a generally columnar outer shape. The first organic solvent nozzle 27 includes an outer cylinder 36 configuring a casing and an inner cylinder 37 fitted in an inside of the outer cylinder 36.

The respective outer cylinder 36 and inner cylinder 37 are coaxially disposed on a common center axis line CL and are connected to each other. An inner space of the inner cylinder 37 serves as a linear organic solvent flow path 38 in which the organic solvent from the first organic solvent line 30 circulates. Further, a cylindrical gas flow path 39 in which the gas supplied from the gas line 31 circulates is formed between the outer cylinder 36 and the inner cylinder 37.

The organic solvent flow path 38 opens at an upper end of the inner cylinder 37 as an organic solvent introducing port 40. The organic solvent from the first organic solvent line 30 is introduced via this the organic solvent introducing port 40 into the organic solvent flow path 38. Further, the organic solvent flow path 38 opens at a lower end of the inner cylinder 37 as a circle-shaped organic solvent discharging port 41 centered on the center axis line CL. The organic solvent introduced into the organic solvent flow path 38 is discharged from this organic solvent discharging port 41.

The gas flow path 39 is a cylindrical clearance having a center axis line common to the center axis line CL and opens as a circular-ring-shaped gas discharging port 42 closed at upper end portions of the outer cylinder 36 and inner cylinder 37, centered on the center axis line CL at lower end portions of the outer cylinder 36 and inner cylinder 37 and surrounding the organic solvent discharging port 41. A lower end portion of the gas flow path 39 has a flow path area smaller than an intermediate portion of the gas flow path 39 in a length direction and has a diameter decreasing downwardly. Further, a gas introducing port 43 communicating with the gas flow path 39 is formed on an intermediate portion of the outer cylinder 36.

The gas line 31 is connected to the gas introducing port 43 while penetrating the outer cylinder 36, and an inner space of the gas line 31 and the gas flow path 39 are communicated. The gas from the gas line 31 is introduced into the gas flow path 39 via this gas introducing port 43 and is discharged from the gas discharging port 42.

The first organic solvent nozzle 27 is disposed above the substrate W such that the organic solvent discharging port 41 is opposed to the upper surface of the substrate W. In this embodiment, a distance between a lower end of the first organic solvent nozzle 27 (lower end of the outer cylinder 36) in this disposed state and the substrate W is set to 20 mm, for example. This distance W2 is set such that the lower end of the first organic solvent nozzle 27 is higher than a height position of a later-described radial gas flow flowing along the upper surface of the substrate (gas flow of inert gas discharged from gas discharging ports 55, 56, 57).

While the gas valve 34 is opened to keep discharging the gas from the gas discharging port 42, the first organic solvent valve 32 is opened to discharge the organic solvent from the organic solvent discharging port 41, thereby to collide (mix) the gas to the organic solvent in a vicinity of the first organic solvent nozzle 27, and thus, minute droplets of the organic solvent can be generated and the organic solvent can be discharged in a manner of spray. Consequently, supply of droplets of the organic solvent to the upper surface of the substrate W can be easily achieved.

As shown in FIG. 2, the second organic solvent supplying unit 9 includes a second organic solvent nozzle (second low-surface-tension liquid nozzle) 44 for supplying a continuous flow of the organic solvent to the upper surface of the substrate W held by the spin chuck 5, a second nozzle arm 45 to whose tip end portion the second organic solvent nozzle 44 is attached, a second nozzle moving unit 46 connected to the second nozzle arm 45 and swinging the second nozzle arm 45 about a second swinging axis line A3. When the second nozzle moving unit 46 swings the second nozzle arm 45, whereby the second organic solvent nozzle 44 is horizontally moved along a trajectory X2 (see FIG. 5) passing the upper surface center portion of the substrate W in plan view.

The second organic solvent nozzle 44 includes a straight pipe along a vertical direction. A second organic solvent supplying mechanism (second low-surface-tension liquid supplying mechanism) 44C supplying the organic solvent to the second organic solvent nozzle 44 is connected to the second organic solvent nozzle 44. The second organic solvent supplying mechanism 44C includes second organic solvent line 47 supplying a liquid of the organic solvent (IPA) at room temperature from the organic solvent supply source to the second organic solvent nozzle 44, a second organic solvent valve 48 interposed in the second organic solvent line 47 and switching discharge and supply stop of the organic solvent from the second organic solvent line 47 to the second organic solvent nozzle 44, and a second flow rate adjusting valve 49 interposed in the second organic solvent line 47 for adjusting a flow rate of the organic solvent discharged from the second organic solvent nozzle 44 by adjusting an opening amount of the second organic solvent line 47. When the second organic solvent valve 48 is opened, the organic solvent of the continuous flow supplied from the second organic solvent line 47 to the second organic solvent nozzle 44 is discharged from a discharging port provided on a lower end of the second organic solvent nozzle 44. Further, when the second organic solvent valve 48 is closed, discharging of the organic solvent from the second organic solvent line 47 to the second organic solvent nozzle 44 is stopped.

The inert gas supplying unit 10 comprises an inert gas nozzle 52 for discharging gas to the upper surface of the substrate W held by the spin chuck 5. The inert gas nozzle 52 is a nozzle for covering above the substrate W by nitrogen gas atmosphere. Inert gas line 50 is coupled to the inert gas nozzle 52. The inert gas line 50 is interposed with an inert gas valve 51 opening and closing its flow path.

In this embodiment, the inert gas nozzle 52 is integrally coupled to the second organic solvent nozzle 44. Thus, the second organic solvent nozzle 44 and the inert gas nozzle 52 are provided on a common nozzle CN. That is, the common nozzle CN has a function as an organic solvent nozzle discharging the organic solvent and a function as an inert gas nozzle discharging the inert gas such as nitrogen gas.

Figure 4:
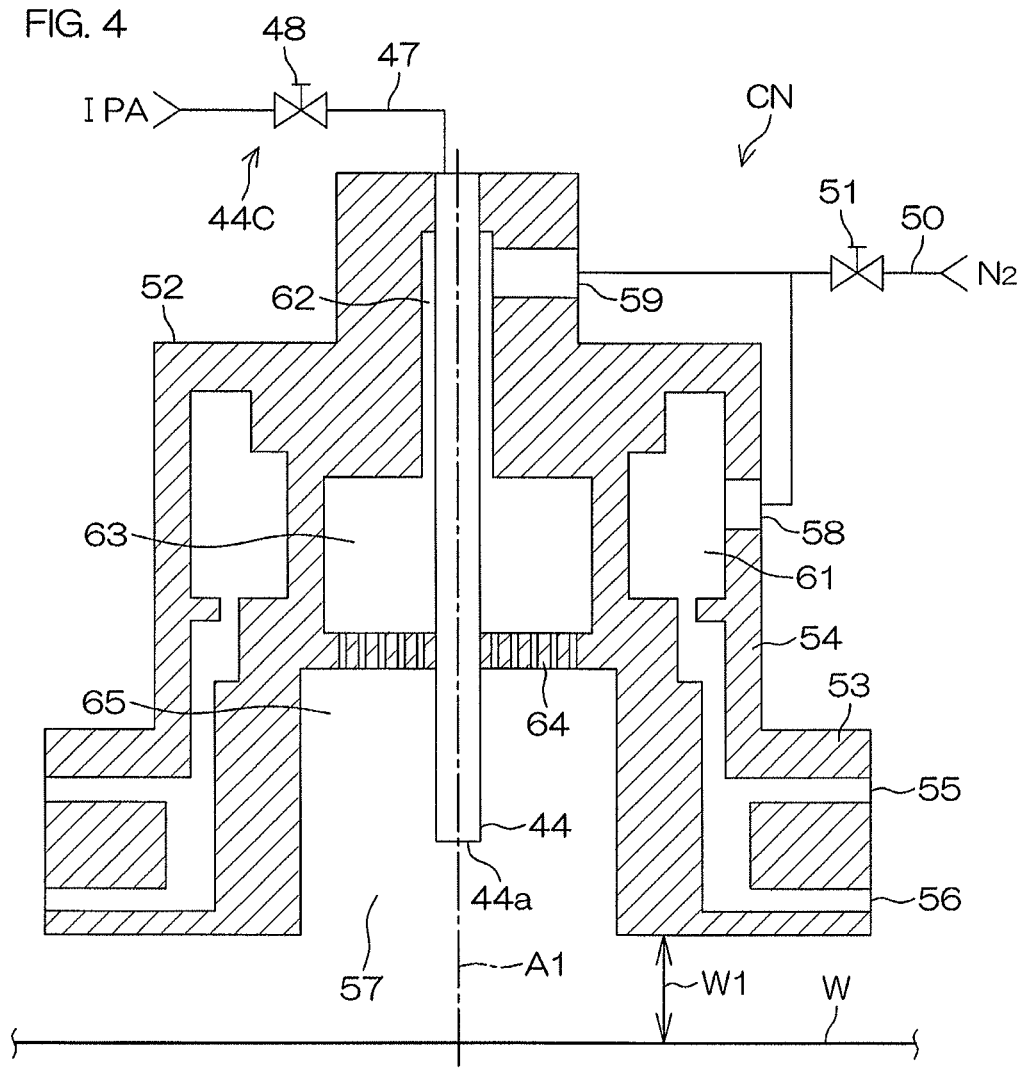
FIG. 4 is an illustrative longitudinal sectional view for describing a configuration example of a common nozzle.

FIG. 4 is an illustrative longitudinal sectional view for describing a configuration example of the common nozzle CN (inert gas nozzle 52).

The inert gas nozzle 52 has a cylindrical nozzle body 54 having a flange portion 53 at a lower end. An outermost diameter of the nozzle body 54 is about 95 to about 120 mm, for example. On an outer peripheral surface, that is a side surface, of the flange portion 53, the upper gas discharging port 55 and the lower gas discharging port 56 respectively open outwardly in a ring-shaped manner. The upper gas discharging port 55 and the lower gas discharging port 56 are disposed in a spaced manner in an up-and-down direction. The center gas discharging port 57 is disposed on a lower surface of the nozzle body 54.

Gas introducing ports 58, 59 to which the inert gas is supplied from the inert gas line 50 are formed on the nozzle body 54. Individual inert gas line may be connected to the gas introducing ports 58, 59. In the nozzle body 54, a tube-shaped gas flow path 61 connecting the gas introducing port 58 with the upper gas discharging port 55 and the lower gas discharging port 56. Further, in the nozzle body 54, a tube-shaped gas flow path 62 communicating with the gas introducing port 59 is formed around the second organic solvent nozzle 44. A buffer space 63 communicates with a lower side of the tube-shaped gas flow path 62. The buffer space 63 further communicates with a space 65 below the buffer space 63 via a punching plate 64. This space 65 opens to the center gas discharging port 57. While nitrogen gas ($N_2$) can be shown as an example of the inert gas supplied to the gas introducing ports 58, 59, inert gas other than nitrogen gas, such as dry air and clean air, may be employed.

The inert gas introduced from the gas introducing port 58 is supplied to the upper gas discharging port 55 and the lower gas discharging port 56 via the gas flow path 61 and is radially discharged from these gas discharging ports 55, 56. Thus, two radial gas flows superimposed in the up-and-down direction are formed above the substrate W. On the other hand, the inert gas introduced from the gas introducing port 59 is stored in the buffer space 63 via the gas flow path 62, is further diffused through the punching plate 64, and then is downwardly discharged through the space 65 from the center gas discharging port 57 toward the upper surface of the substrate W. This inert gas hits the upper surface of the substrate W to change a direction and forms an inert gas flow in a radial direction above the substrate W.

Therefore, the radial gas flow including the inert gas discharged from the center gas discharging port 57 and two layers of the radial gas flows discharged from the gas discharging ports 55, 56 are combined to form three layers of the radial gas flows above the substrate W. The upper surface of the substrate W is protected by these three layers of the radial gas flows. In particular, as described below, when the substrate W is rotated at a high speed, the upper surface of the substrate W is protected by the three layers of the radial gas flows, whereby liquid droplets and mist can be prevented from being adhered on the surface of the substrate W.

In this embodiment, the common nozzle CN is disposed near the upper surface of the substrate W in a replacing step (S4). At this time, a distance W1 between a lower end face of the common nozzle CN (inert gas nozzle 52) and the substrate W is set to about 4 mm, for example. In this state, the radial gas flows discharged from the gas discharging ports 55, 56, 57 flow, for example, in a manner of being minutely spaced from the upper surface of the substrate W or in a manner of being close to the upper surface of the substrate W, along the upper surface of the substrate W. In other words, these radial gas flows flow in a region below the lower end of the first organic solvent nozzle 27 with respect to the up-and-down direction.

The second organic solvent nozzle 44 extends in the up-and-down direction while penetrating the gas flow path 62, the buffer space 63, and the punching plate 64. The discharging port 44a at the lower end of the second organic solvent nozzle 44 is disposed below the punching plate 64 and discharges the organic solvent toward the upper surface of the substrate W from vertically above.

Figure 5:
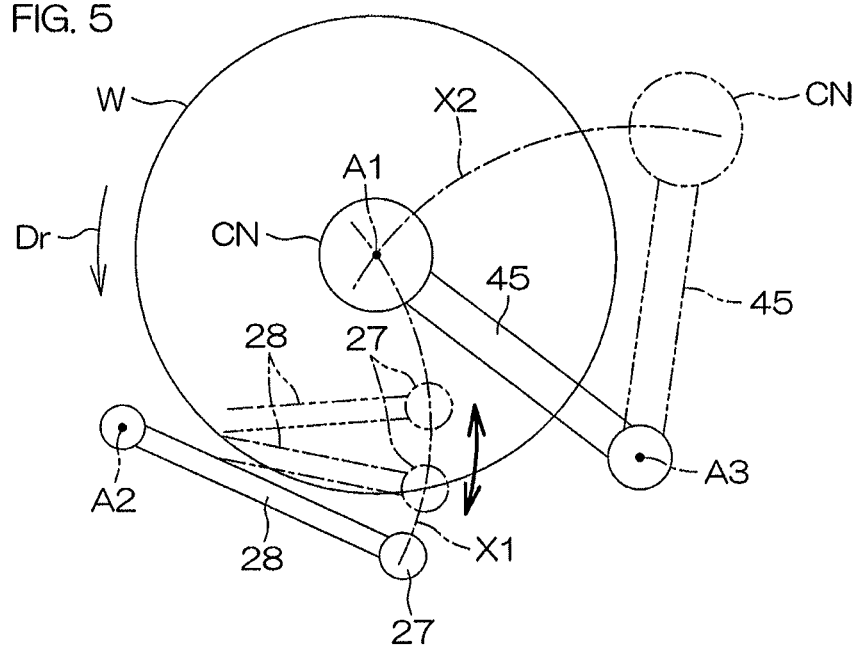
FIG. 5 is a schematic plan view for describing the first organic solvent nozzle and the common nozzle.

FIG. 5 is a schematic plan view for describing movement of the first organic solvent nozzle 27 and the common nozzle CN.

As shown in FIG. 5, the first nozzle moving unit 29 moves the first organic solvent nozzle 27 horizontally along the arc-shaped trajectory X1 passing the upper surface center portion of the substrate W (specifically the rotation axis line A1) held by the spin chuck 5. The first nozzle moving unit 29 moves the first organic solvent nozzle 27 horizontally between a treatment position where the organic solvent discharged from the first organic solvent nozzle 27 contacts the upper surface of the substrate W and a home position where the first organic solvent nozzle 27 is set around the spin chuck 5 in plan view. Further, the first nozzle moving unit 29 moves the first organic solvent nozzle 27 horizontally between a first peripheral edge position (shown by a two-dot chain line in FIG. 5) near an inside of an upper surface peripheral edge portion of the of the substrate W and a second peripheral edge position (shown by a chain line in FIG. 5) near an outside of the upper surface peripheral edge portion of the substrate W. When the first organic solvent nozzle 27 is positioned at the first peripheral edge position, a supply region (liquid contact region) DA (see FIG. 15C) of the organic solvent on the upper surface of the substrate W is disposed at a predetermined position separated from a peripheral end edge of the substrate W to a side of the rotation axis line A1 of the substrate W by about 40 to 50 mm. On the other hand, when the first organic solvent nozzle 27 is positioned at the second peripheral edge position, the supply region DA (see FIG. 15C) of the organic solvent on the upper surface of the substrate W is disposed at the peripheral end edge of the substrate W. Both of the first peripheral edge position and the second peripheral edge position are treatment positions.

As shown in FIG. 5, the second nozzle moving unit 46 moves the common nozzle CN horizontally along the arc-shaped trajectory X2 passing the upper surface center portion of the substrate W (specifically on the rotation axis line A1) held by the spin chuck 5. The second nozzle moving unit 46 moves the common nozzle CN between a treatment position (shown by a solid line in FIG. 5) above the center portion of the substrate W and the home position (shown by the two-dot chain line in FIG. 5) laterally retracted from above the substrate W. In a state where the common nozzle CN is at the treatment position, the organic solvent discharged from the second organic solvent nozzle 44 contacts the upper surface center portion (specifically on the rotation axis line A1) of the substrate W.

As shown in FIG. 2, the lower surface supplying unit 11 includes a lower surface nozzle 70 discharging upward a temperature adjusting liquid as one example of temperature adjusting fluids, temperature adjusting liquid line 67 guiding the temperature adjusting liquid to the lower surface nozzle 70, a temperature adjusting liquid valve 68 interposed in the temperature adjusting liquid line 67, and a third flow rate adjusting valve 69 interposed in the temperature adjusting liquid line 67 for adjusting a flow rate of the temperature adjusting liquid discharging upward from the lower surface nozzle 70 by adjusting an opening amount of the temperature adjusting liquid line 67. When the temperature adjusting liquid valve 68 is opened, the temperature adjusting liquid from a temperature adjusting liquid supply source is supplied from the temperature adjusting liquid line 67 to the lower surface nozzle 70 at a flow rate corresponding to an opening amount of the third flow rate adjusting valve 69. Thus, the temperature adjusting liquid at a high temperature (for example, a temperature of 75° C. near a boiling point of IPA (about 80° C.)) is discharged from the lower surface nozzle 70. The temperature adjusting liquid supplied to the lower surface nozzle 70 is heated pure water. Types of the temperature adjusting liquid supplied to the lower surface nozzle 70 are not limited to pure water but may be carbonated water, electrolytic ion water, hydrogen water, ozone water, IPA (isopropyl alcohol), hydrochloric acid water of a dilute concentration (for example, around 10 ppm to 100 ppm), and the like. Further, the supplied temperature adjusting fluid is not limited to the temperature adjusting liquid, but in place of the temperature adjusting liquid, temperature adjusting gas (heating gas) may be supplied to the lower surface of the substrate W.

Figure 6:
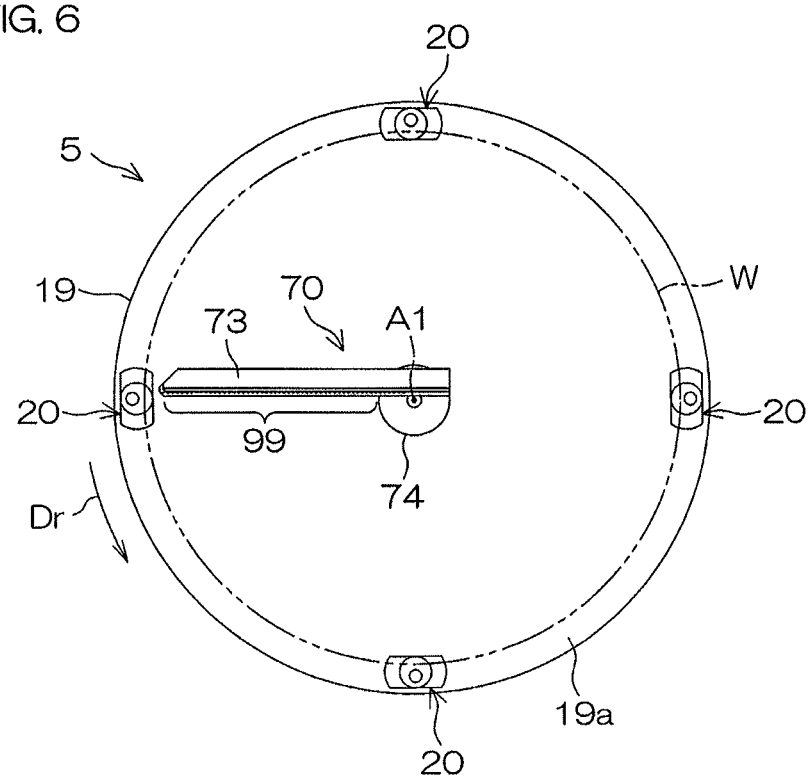
FIG. 6 is a schematic plan view for describing a spin chuck and a lower surface nozzle.
Figure 7:
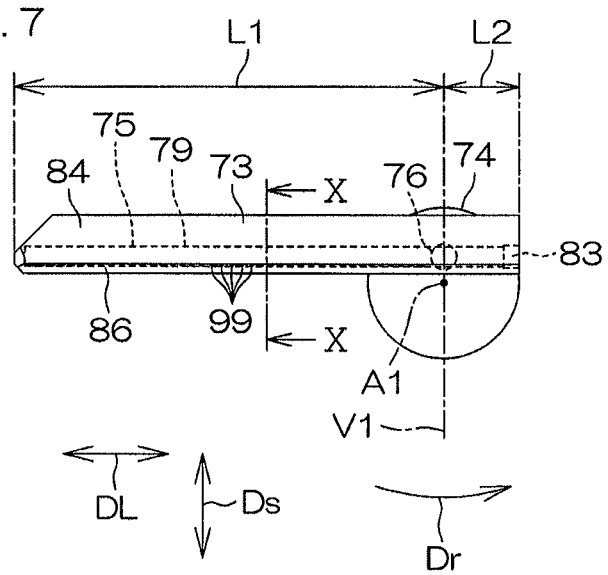
FIG. 7 is a schematic plan view of the lower surface nozzle.
Figure 8:
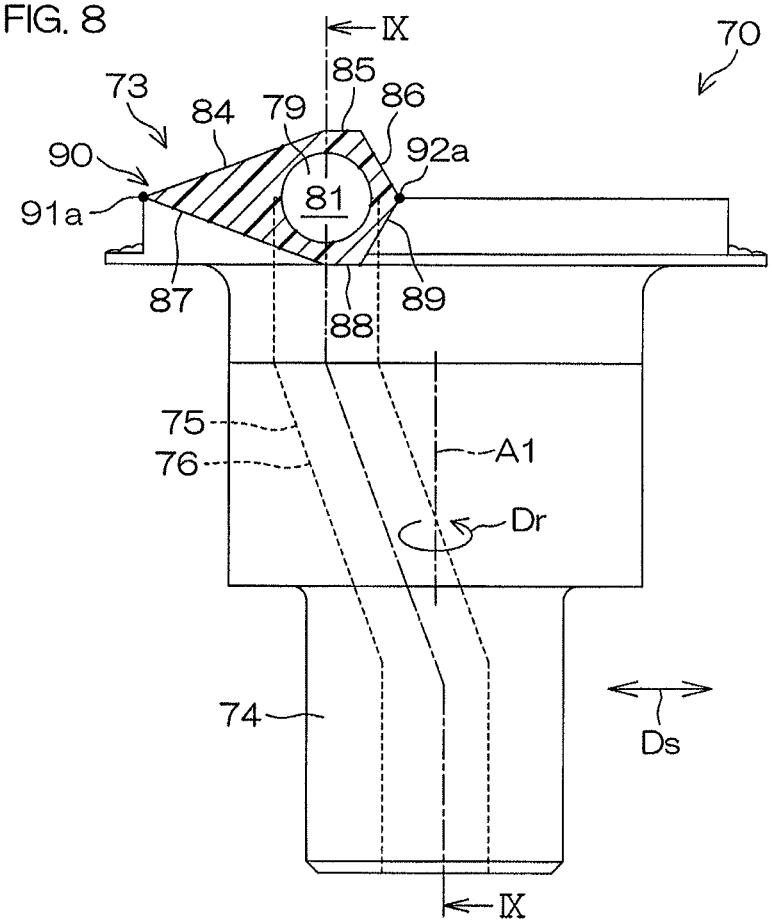
FIG. 8 is a partial sectional view where the lower surface nozzle is viewed in a longitudinal direction of a nozzle portion.
Figure 9:
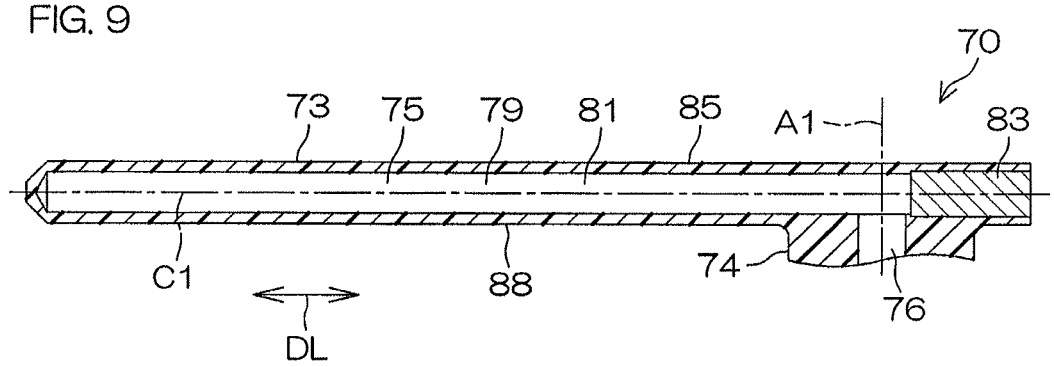
FIG. 9 is a sectional view of the lower surface nozzle along an IX-IX line shown in FIG. 8.
Figure 10:
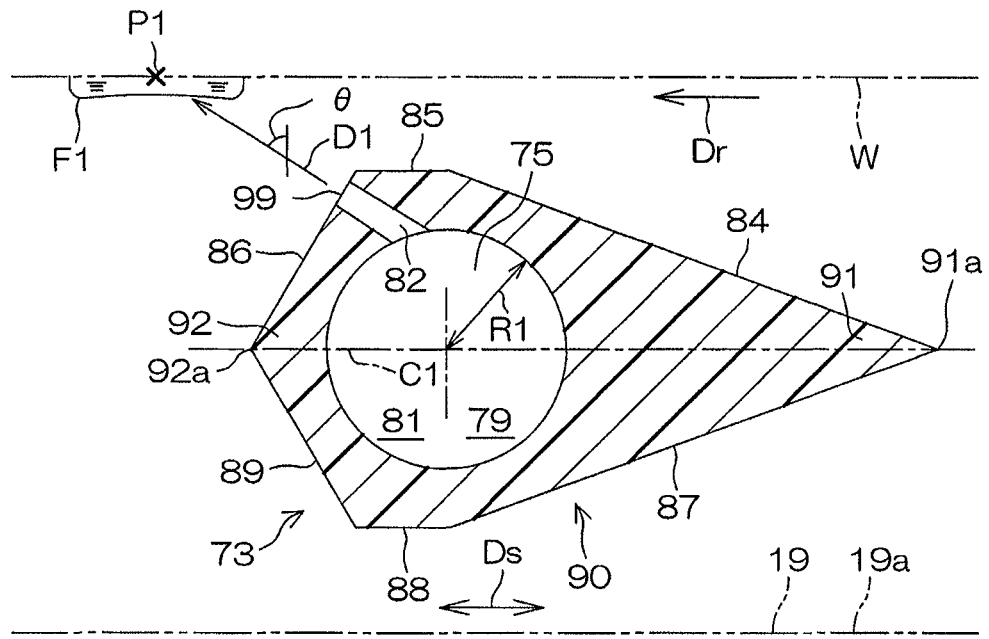
FIG. 10 is a view showing a vertical section of the nozzle portion along an X-X line shown in FIG. 7.
Figure 11:
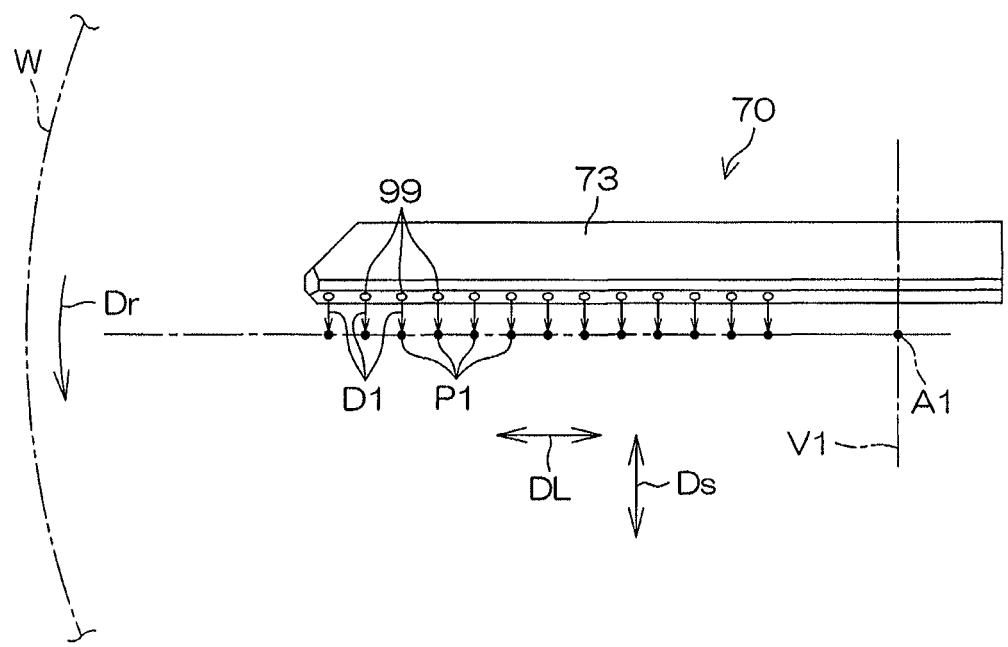
FIG. 11 is a schematic plan view showing a state where the nozzle portion is discharging a temperature adjusting liquid.

FIG. 6 is a schematic plan view for describing the spin chuck 5 and the lower surface nozzle 70. FIG. 7 is a schematic plan view of the lower surface nozzle 70. FIG. 8 is a partial sectional view where the lower surface nozzle 70 is viewed in a longitudinal direction of a nozzle portion 73. FIG. 9 is a sectional view of the lower surface nozzle 70 along an IX-IX line shown in FIG. 8. FIG. 10 is a view showing a vertical section of the nozzle portion 73 along an X-X line shown in FIG. 7. FIG. 11 is a schematic plan view showing a state where the nozzle portion 73 is discharging a temperature adjusting liquid.

A configuration of the lower surface nozzle 70 is described below referring to FIGS. 2 and 6 to 11.

The lower surface nozzle 70 has a form of so-called bar nozzle comprising the nozzle portion 73. As shown in FIG. 6, the lower surface nozzle 70 includes the nozzle portion 73 where a plurality of discharging ports 99 discharging the temperature adjusting liquid are arranged along a rotation radius direction of the substrate W, and a base portion 74 supporting the nozzle portion 73. The lower surface nozzle 70 is formed by using a synthetic resin having a chemical resistance such as PTFE (polytetrafluoroethylene). The base portion 74 has a columnar shape coaxial with the rotation axis line A1. The base portion 74 is disposed at a position opposed to a lower surface center portion of the substrate W. The base portion 74 protrudes upward from a center portion of the upper surface 19a of the spin base 19. The nozzle portion 73 is disposed above the base portion 74. The nozzle portion 73 is disposed between a lower surface of the substrate W and the upper surface 19a of the spin base 19.

As shown in FIG. 7, the nozzle portion 73 includes a root portion superimposing with the base portion 74 in plan view, a tip end portion disposed radially outward from the base portion 74, and an intermediate portion extending from the root portion to the tip end portion. A distance L1 of a longitudinal direction (direction along the rotation radius direction) DL from a virtual straight line V1 orthogonal to both of the rotation axis line A1 and the longitudinal direction DL to a tip end of the nozzle portion 73 is larger than a distance L4 of the longitudinal direction DL from the virtual straight line V1 to a root of the nozzle portion 73. A radial direction from the rotation axis line A1 to the tip end of the nozzle portion 73 is smaller than a radius of the substrate W.

As shown in FIG. 8, the lower surface nozzle 70 includes a temperature adjusting liquid supplying path 75 supplying the temperature adjusting liquid to a plurality of discharging ports 99. The temperature adjusting liquid supplying path 75 includes a downstream portion 79 provided on the nozzle portion 73 and an upstream portion 76 provided on the base portion 74. The upstream portion 76 and the downstream portion 79 are connected to each other at a position more upstream than the plurality of discharging ports 99. A shape of a vertical section 90 (see FIG. 8) of the nozzle portion 73 is uniform over a generally entire area in the longitudinal direction DL.

As shown in FIGS. 8 to 10, the downstream portion 79 of each temperature adjusting liquid supplying path 75 includes a main flow path 81 guiding the temperature adjusting liquid guided to the plurality of discharging ports 99, and a plurality of branch flow paths 82 supplying the temperature adjusting liquid in the main flow path 81 to the plurality of discharging ports 99. As shown in FIG. 9, the main flow path 81 has a columnar shape extending in the longitudinal direction DL within the nozzle portion 73. The main flow path 81 is disposed between a plug 83 attached to the root portion of the nozzle portion 73 and the tip end portion of the nozzle portion 73. A flow path area (area of a section orthogonal to a direction to which a fluid flows) of the main flow path 81 is larger than a flow path area of any of the branch flow paths 82. As shown in FIG. 10, a radius R1 of a section of the main flow path 81 is larger than a flow path length (length from an upstream end of the branch flow path 82 to a downstream end of the branch flow path 82) of any of the branch flow paths 82. As shown in FIG. 10, the plurality of branch flow paths 82 are respectively connected to the plurality of discharging ports 99. The upstream end of the branch flow path 82 is connected to the main flow path 81 at a position upper than a horizontal center surface C1 passing a center of the vertical section 90 in the vertical direction. The downstream end of the branch flow path 82 is connected to one of the plurality of discharging ports 99.

As shown in FIGS. 8 and 10, an outer surface of the nozzle portion 73 includes an upper upstream inclined surface 84 extending obliquely upward toward downstream in a rotation direction Dr, an upper horizontal surface 85 extending horizontally in the rotation direction Dr from the upper upstream inclined surface 84, and an upper downstream inclined surface 86 extending obliquely downward toward downstream in the rotation direction Dr from the upper horizontal surface 85. The outer surface of the nozzle portion 73 further includes a lower upstream inclined surface 87 extending obliquely downward toward downstream in the rotation direction Dr, a lower horizontal surface 88 extending horizontally in the rotation direction Dr from the lower upstream inclined surface 87, and a lower downstream inclined surface 89 extending obliquely upward toward downstream in the rotation direction Dr from the lower horizontal surface 88.

As shown in FIG. 10, the upper upstream inclined surface 84 is longer than the upper downstream inclined surface 86 in a transverse direction Ds (horizontal direction orthogonal to the longitudinal direction DL). Similarly, the lower upstream inclined surface 87 is longer than the lower downstream inclined surface 89 in the transverse direction Ds. The upper upstream inclined surface 84 and the lower upstream inclined surface 87 intersect at the most upstream position (upstream end 91a) in the vertical section 90 of the nozzle portion 73. The upper downstream inclined surface 86 and the lower downstream inclined surface 89 intersect at the most downstream position (downstream end 92a) in the vertical section 90 of the nozzle portion 73.

As shown in FIG. 10, the vertical section 90 of the nozzle portion 73 includes an upstream end portion 91 having a triangular shape convex on an upstream side in the rotation direction Dr, and a downstream end portion 92 having a triangular shape convex on an downstream side in the rotation direction Dr. An upper edge of the upstream end portion 91 is part of the upper upstream inclined surface 84, and a lower edge of the upstream end portion 91 is part of the lower upstream inclined surface 87. Similarly, an upper edge of the downstream end portion 92 is part of the upper downstream inclined surface 86, and a lower edge of the downstream end portion 92 is part of the lower downstream inclined surface 89.

As shown in FIG. 10, the upstream end portion 91 includes the upstream end 91a disposed on the most upstream side in the vertical section 90 of the nozzle portion 73. The downstream end portion 92 includes the downstream end 92a disposed on the most downstream side in the vertical section 90 of the nozzle portion 73. A thickness of the upstream end portion 91 (length in the vertical direction) decreases as approaching the upstream end 91a. A thickness of the downstream end portion 92 (length in the vertical direction) decreases as approaching the downstream end 92a.

The plurality of discharging ports 99 provided on the nozzle portion 73 open on the upper downstream inclined surface 86.

As shown in FIG. 11, the plurality of discharging ports 99 are arranged in the longitudinal direction DL of the nozzle portion 73 at intervals. Opening areas of respective discharging ports 99 are equal to one another. However, the opening areas of the discharging ports 99 may be different from one another. For example, the opening areas of the discharging ports 99 on a peripheral edge side of the substrate W may be larger than the opening areas of the discharging ports 99 on the side of the rotation axis line A1. Since the substrate W has a lower temperature on the peripheral edge side than on a center side, the substrate W can be evenly heated in the radial direction by differentiating the opening areas of the discharging ports 99 in this way.

As shown in FIG. 10, the discharging port 99 discharges the temperature adjusting liquid in a discharging direction D1 toward a liquid contact position P1 within the lower surface of the substrate W. The liquid contact position P1 is a position downstream of the discharging port 99 in the rotation direction Dr. The liquid contact position P1 is a position spaced from a center of the lower surface of the substrate W. The discharging direction D1 is an obliquely upward direction from the discharging port 99 toward the liquid contact position P1. The discharging direction D1 is tilted to the downstream side in the rotation direction Dr with respect to the lower surface of the substrate W. A tilt angle θ of the discharging direction D1 with respect to the vertical direction is, for example, 30°. A distance from each discharging port 99 to the lower surface of the substrate W in the vertical direction is, for example, 1.3 mm.

As shown in FIG. 11, the discharging port 99 and the liquid contact position P1 are arranged in the transverse direction Ds when viewed from a direction orthogonal to the rotation axis line A1, that is, viewed in plan view. The liquid contact position P1 is disposed in a spaced manner from the discharging port 99 in the discharging direction D1 by 2.25 mm, for example. The discharging direction D1 is a direction parallel with the virtual straight line V1 in plan view, and this is a direction intersecting (in this case, orthogonal) in a radial direction of the substrate W in plan view. Further, the discharging port 99 discharges the temperature adjusting liquid in a direction along the rotation direction Dr of the substrate W in plan view.

As shown in FIG. 10, the temperature adjusting liquid discharged from the discharging port 99 expands along the lower surface of the substrate W by momentum of contacting the liquid contact position P1 and forms a liquid film of the temperature adjusting liquid covering the liquid contact position P1. The liquid contact position P1 is a position spaced from the center (rotation axis line A1) of the lower surface of the substrate W.

Figure 12:
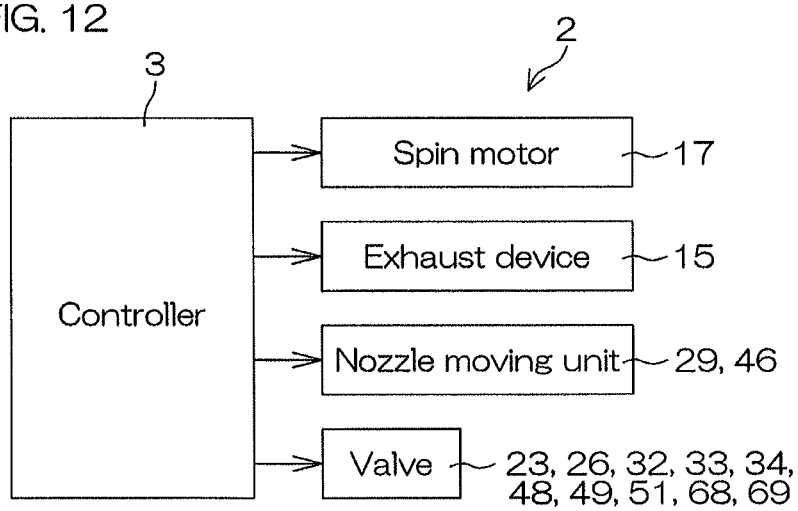
FIG. 12 is a block diagram for describing an electrical configuration of a main portion of the substrate processing apparatus.

FIG. 12 is a block diagram for describing an electrical configuration of a main portion of the substrate processing apparatus 1.

The controller 3 controls motion of the spin motor 17, the exhaust device 15, the nozzle moving units 29, 46, and the like according to a predetermined program. Further, the controller 3 controls opening and closing motion and the like of the chemical liquid valve 23, the rinsing liquid valve 26, the first organic solvent valve 32, the first flow rate adjusting valve 33, the gas valve 34, the second organic solvent valve 48, the second flow rate adjusting valve 49, the inert gas valve 51, the temperature adjusting liquid valve 68, the third flow rate adjusting valve 69, and the like.

Figure 13:
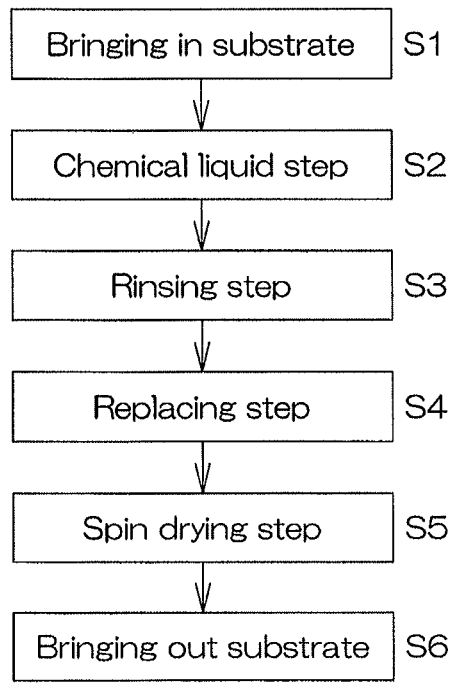
FIG. 13 is a flowchart for describing one example of a substrate processing by the substrate processing apparatus.

FIG. 13 is a flowchart for describing one example of a substrate processing by the substrate processing apparatus 1. FIG. 14 is a timing chart for describing the replacing step (S4) and a spin drying step (S5). Description is made referring to FIGS. 2, 13, and 14.

An untreated substrate W is brought from the carrier C into the unit 2 by the transport robots IR, CR, is brought into the processing chamber 4, is delivered to the spin chuck 5 with the surface of the substrate W (pattern forming surface) facing upward, and is held by the spin chuck 5 (S1: substrate holding process). Before the substrate W is brought in, the first organic solvent nozzle 27 is retracted at the home position (shown by the solid line in FIG. 5) set laterally of the spin chuck 5. Further, the common nozzle CN is also retracted at the home position (shown by the two-dot chain line in FIG. 5) set laterally of the spin chuck 5.

After the transport robot CR is retracted out of the unit 2, the controller 3 executes a chemical liquid step (step S2). Specifically, the controller 3 drives the spin motor 17 to rotate the spin base 19 at a predetermined liquid treatment rotation speed. Further, the controller 3 opens the chemical liquid valve 23. Thus, a chemical liquid is discharged from the chemical liquid nozzle 21 toward the upper surface of the substrate W. The supplied chemical liquid reaches an entire area of the upper surface of the substrate W by a centrifugal force, and the substrate W is subjected to a chemical liquid treatment using the chemical liquid. After a predetermined period has passed from start of discharging of the chemical liquid, the controller 3 closes the chemical liquid valve 23 to stop discharging of the chemical liquid from the chemical liquid nozzle 21.

Then the controller 3 executes a rinsing step (step 3). The rinsing step removes the chemical liquid from the substrate W by replacing the chemical liquid on the substrate W with the rinsing liquid. Specifically, the controller 3 opens the rinsing liquid valve 26. Thus, the rinsing liquid nozzle 24 discharges the rinsing liquid toward the upper surface of the substrate Win a rotated state. The supplied rinsing liquid reaches the entire area of the upper surface of the substrate W by a centrifugal force. This rinsing liquid washes away the chemical liquid adhered on the substrate W.

After a predetermined period has passed from start of discharging of the rinsing liquid, the controller 3 controls the spin motor 17 to decelerate a rotation speed of the substrate W in a stepwise manner from the liquid treatment rotation speed (for example, about 300 rpm) to a paddle speed (for example, about 10 rpm), and then keeps the rotation speed of the substrate W at the paddle speed (paddle rinsing step). Thus, a liquid film 110 (see FIG. 15A) of the rinsing liquid covering the entire area of the upper surface of the substrate W is supported on the upper surface of the substrate W in a paddle like. After a predetermined period has passed from start of discharging of the rinsing liquid, the controller 3 closes the rinsing liquid valve 26 to stop discharging of the rinsing liquid from the rinsing liquid nozzle 24. Further, while a low speed of 10 rpm is shown as an example of the paddle speed, the paddle speed may be a low speed of 50 rpm or less, or may be zero.

Next, the controller 3 executes the replacing step (step S4). The replacing step (S4) replaces the rinsing liquid on the substrate W with an organic solvent having a surface tension lower than that of the rinsing liquid (water).

Further, in the replacing step (S4), the controller 3 opens the inert gas valve 51 to discharge nitrogen gas from the three gas discharging ports 55, 56, 57 (see FIG. 4). Over the entire period of the replacing step (S4), the inert gas is supplied to above the substrate W in parallel with supply of the organic solvent to the upper surface of the substrate W, and therefore, over the entire period of the replacing step (S4), a humidity of a space SP of the upper surface of the substrate W can be kept low.

Further, in the replacing step (S4), the temperature adjusting liquid is discharged upwardly from each discharging port 99 of the lower surface nozzle 70 to supply the temperature adjusting liquid to the lower surface (rear surface) of the substrate W. Specifically, as shown in FIG. 15B, the temperature adjusting liquid is discharged from the plurality of discharging ports 99 (see both of FIGS. 10 and 11) arranged in the longitudinal direction DL to the lower surface (rear surface) of the substrate W. The temperature adjusting liquid can be supplied to the entire area of the lower surface (rear surface) of the substrate W by rotating the substrate W in parallel with discharging of the temperature adjusting liquid discharged from the discharging ports 99.

Figure 15C:
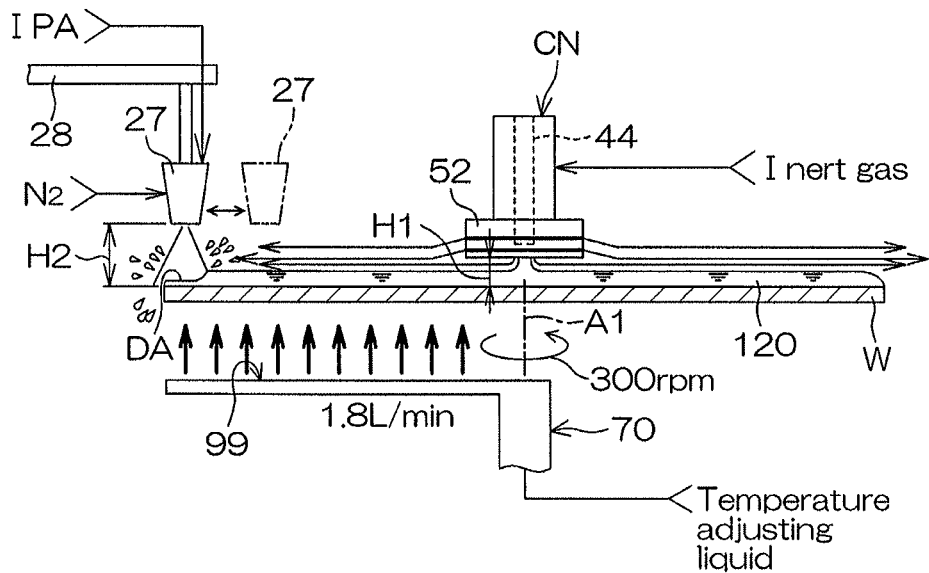
FIGS. 15C to 15D are illustrative sectional views for describing appearances of the replacing step.
Figure 15D:
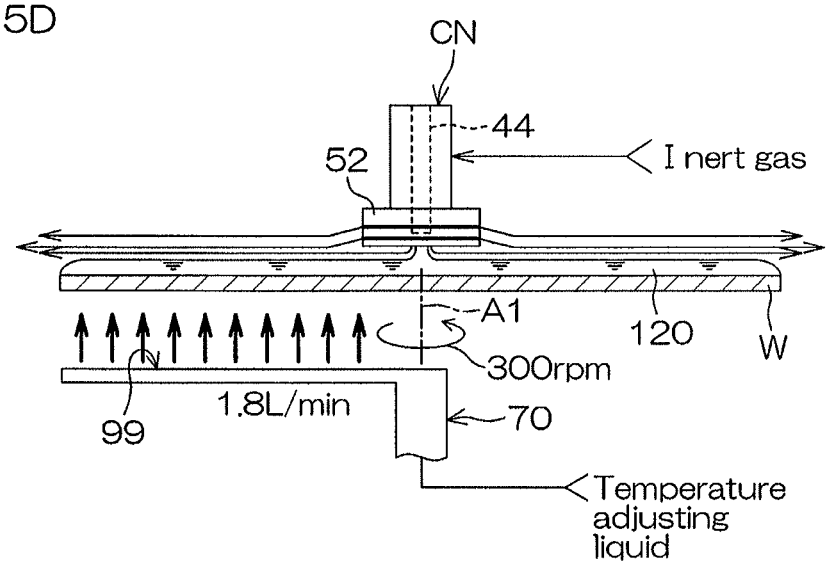

As shown in FIG. 14, the replacing step (S4) includes a first liquid film forming step T1 (see also FIG. 15B), a liquid drop discharging step T2 (see also FIG. 15C), and a second liquid film forming step T3 (see also FIG. 15B).

FIGS. 15A to 15D are illustrative sectional views for describing appearances of respective steps of the replacing step (S4). The replacing step (S4) is described referring to FIGS. 2, 12, 13, and 14. FIGS. 15A to 15D are referred to according to need.

The first liquid film forming step T1 (see FIG. 15A) forms a liquid film 120 of the organic solvent covering the entire area of the upper surface on this upper surface of the substrate W by supplying the organic solvent to the upper surface of the substrate W while rotating the substrate W at a relatively low speed (for example, about 10 rpm).

Before start of the first liquid film forming step T1, the controller 3 moves the common nozzle CN from the home position laterally of the spin chuck 5 to the treatment position (above the upper surface center portion of the substrate W) as shown in FIG. 15A. In a state where the common nozzle CN is disposed at the treatment position, a center axis line of the common nozzle CN coincides with the rotation axis line A1 as shown in FIG. 4.

After the common nozzle CN is disposed at the treatment position, the controller 3 controls the second nozzle moving unit 46 to descend the common nozzle CN from an upper position to a proximate position closer to the substrate W than the upper position. In a state where the common nozzle is at a lower position, the distance W1 between a lower surface of the common nozzle CN and the upper surface of the substrate W is 4 mm, for example.

When a start timing of the first liquid film forming step T1 comes, the controller 3 opens the second organic solvent valve 48. Thus, a liquid of the organic solvent is discharged from the discharging port 44a of the second organic solvent nozzle 44 (cover IPA discharge). A discharge flow rate of the organic solvent from the second organic solvent nozzle 44 is set to about 0.3 (litter/minute), for example. The liquid of the organic solvent discharged from the second organic solvent nozzle 44 is supplied to a center portion of the upper surface of the substrate W and reaches the entire area of the substrate W due to a centrifugal force by rotation of the substrate W, whereby the rinsing liquid contained in the liquid film 110 of the rinsing liquid on the upper surface of the substrate W is replaced with the organic solvent in succession. Thus, the liquid film 120 of the organic solvent covering the entire area of the upper surface of the substrate W on the upper surface of the substrate W, and this liquid film 120 of the organic solvent is supported in a paddle form. A paddle means a state where the organic solvent remains on the upper surface of the substrate W to form a liquid film as a result that the organic solvent is subjected to a zero or small centrifugal force since the rotation speed of the substrate W is zero or a low speed.

Further, being synchronized with the start of discharging of the organic solvent to the upper surface of the substrate W (start of the first liquid film forming step T1), the controller 3 opens the temperature adjusting liquid valve 68. Thus, the temperature adjusting liquid is discharged upward from each discharging port 99 of the lower surface nozzle 70 to start supplying the temperature adjusting liquid to the lower surface (rear surface) of the substrate W. Thus, the temperature adjusting liquid discharged from each discharging port 99 of the lower surface nozzle 70 contacts the lower surface of the substrate W. A discharge flow rate of the temperature adjusting liquid from the lower surface nozzle 70 is set to, for example, about 1.8 (litter/minute), and this discharge flow rate is set such that this temperature adjusting liquid does not come to a front side from a peripheral edge portion of the substrate W. Since the temperature adjusting liquid is supplied to the lower surface (rear surface) of the substrate W in this manner, the first liquid film forming step T1 can be executed while a temperature of the liquid film 120 of the organic solvent on the substrate W is adjusted. Thus, a replacement performance from the rinsing liquid to the organic solvent can be increased.

In this embodiment, the temperature adjusting liquid enters the lower surface of the substrate W from each discharging port 99 at an angle inclined by the tilt angle θ (see FIG. 10) from the vertical direction. Further, the temperature adjusting liquid is supplied from the plurality of discharging ports 99. Depending on these things, in this embodiment, the temperature adjusting liquid does not easily splash on the lower surface of the substrate W, and splash of the temperature adjusting liquid is suppressed from adhering to the surface of the substrate.

Further, in this embodiment, each discharging port 99 discharges the temperature adjusting liquid in a direction intersecting in the radial direction of the substrate W and in the direction along the rotation direction Dr of the substrate W in top view. Thus, the temperature adjusting liquid does not easily come from a lower surface side of the substrate W to the upper surface of the substrate W.

Further, being synchronized to the start of discharging of the organic solvent to the upper surface of the substrate W (start of the first liquid film forming step T1), the controller 3 opens the inert gas valve 51 to start discharging nitrogen gas from the three gas discharging ports (the upper gas discharging port 55 (see FIG. 4), the lower gas discharging port 56 (see FIG. 4), and the center gas discharging port 57 (see FIG. 4)) of the inert gas nozzle 52. Discharge flow rates of nitrogen gas from the upper gas discharging port 55, the lower gas discharging port 56 and the center gas discharging port 57 at this time are respectively 100 (litter/minute), 100 (litter/minute) and 50 (litter/minute), for example. Thus, three layers of ring-shaped gas flow superimposed in the up-and-down direction are formed above the substrate W, and the upper surface of the substrate W is protected by this three layers of ring-shaped gas flow.

In the first liquid film forming step T1, the rotation speed of the substrate W is kept at the paddle speed for about 3.5 seconds, for example, after start of the first liquid film forming step T1, the rotation of the substrate W is then accelerated to an organic solvent treatment speed (for example, about 300 rpm; set equally to the above-described liquid treatment rotation speed, for example) and is kept at this organic solvent treatment speed. Further, a predetermined period (for example, about 12 seconds) has passed from start of the first liquid film forming step T1, the first liquid film forming step T1 is finished, and then the liquid drop discharging step T2 (see FIG. 15C) are started.

The liquid drop discharging step T2 is a step (center portion discharging step, peripheral edge portion discharging and supplying step) which supplies a continuous flow of the organic solvent to the upper surface center portion of the substrate W and, at the same time, supplies liquid drops of the organic solvent to the upper surface peripheral edge portion of the substrate W while rotating the substrate W. The liquid drop discharging step T2 supplies nitrogen gas continuously from the first liquid film forming step T1. That is, in parallel with the supply of the organic solvent, nitrogen gas is supplied to above the substrate W (inert gas supplying step). Further, in this embodiment, when a substrate having a diameter of 300 mm is employed as the substrate W, the peripheral edge portion of the substrate W is a region having a width of 40 mm to 50 mm inward from the peripheral end edge of the substrate W.

As shown FIG. 15C, prior to the start of the liquid drop discharging step T2, the controller 3 controls the nozzle moving unit 29 to move the first organic solvent nozzle 27 from the home position laterally of the spin chuck 5 to the treatment position (above the upper surface peripheral edge portion of the substrate W). In a state where the first organic solvent nozzle 27 is disposed at the treatment position, the distance W2 between the lower end of the first organic solvent nozzle 27 and the upper surface of the substrate W is 20 mm, for example.

When a start timing of the liquid drop discharging step T2 comes, the controller 3 opens the first organic solvent valve 32 and the gas valve 34 while keeping the rotation of the substrate W at the organic solvent treatment speed (for example, about 300 rpm) and keeping the second organic solvent valve 48, the inert gas valve 51 and the temperature adjusting liquid valve 68 at open states. Thus, the organic solvent and gas (nitrogen gas) are supplied simultaneously to the first organic solvent nozzle 27 which is a two-fluid nozzle, and the supplied organic solvent and gas are mixed in a vicinity of an external discharging port (organic solvent discharging port 41 (see FIG. 5)) of the first organic solvent nozzle 27. Thus, a jet flow of minute liquid drops of the organic solvent is formed, the jet flow of minute liquid drops of the organic solvent is discharged downwardly from the first organic solvent nozzle 27 (two-fluid IPA discharge), and the circular supply region DA is formed on the upper surface peripheral edge portion of the substrate W. A discharge flow rate of the organic solvent from the first organic solvent nozzle 27 at this time is set to about 0.1 (litter/minute), for example.

Further, in the liquid drop discharging step T2, the controller 3 controls the nozzle moving unit 29 to reciprocate horizontally the first organic solvent nozzle 27 between the first peripheral edge position (shown by the two-dot chain line in FIG. 5) and the second peripheral edge position (shown by the chain line in FIG. 5) along the trajectory X1 (trajectory equal to that in FIG. 5). Specifically, after disposing the first organic solvent nozzle 27 at the second peripheral edge position (shown by the chain line in FIG. 5), the controller 3 starts discharge from the first organic solvent nozzle 27 and, at the same time, starts moving the first organic solvent nozzle 27. A moving speed of the first organic solvent nozzle 27 (that is, a scanning speed of the supply region DA) at this time is set to about 7 mm/second, for example. Thus, the supply region DA scans extensively the entire area of the upper surface peripheral edge portion of the substrate W. Consequently, liquid drops of the organic solvent spouted from the first organic solvent nozzle 27 can be supplied to an extensive area of the upper surface peripheral edge portion of the substrate W. The organic solvent supplied to the upper surface of the substrate W is drained from the peripheral edge portion of the substrate W to outside of the substrate W.

A physical force is applied to the supply region DA of liquid drops of the organic solvent on the upper surface of the substrate W by collision of liquid drops of the organic solvent. Thus, the replacement performance to the organic solvent on the upper surface peripheral edge portion of the substrate can be increased.

Generally, the peripheral edge portion of the upper surface of the substrate W is considered being low in replacement performance to the organic solvent. However, the replacement performance to the organic solvent on the peripheral edge portion of the upper surface of the substrate W can be improved by setting the supply region DA of liquid drops of the organic solvent on the peripheral edge portion of the upper surface of the substrate W. A supply position of the organic solvent from the first organic solvent nozzle 27 is provided in a scannable manner by providing the first organic solvent nozzle 27 supplying the organic solvent to the upper surface peripheral edge portion of the substrate W separately from the second organic solvent nozzle 44 supplying the organic solvent to the upper surface center portion of the substrate W and providing this first organic solvent nozzle 27 in a movable manner with respect to the second organic solvent nozzle 44. Particularly, liquid drops of the organic solvent can be selectively supplied to the upper surface center portion of the substrate W by letting the supply region DA not scan the substrate upper surface center portion but scan concentratedly the upper surface peripheral edge portion of the substrate W, whereby the replacement performance to the organic solvent on the peripheral edge portion of the upper surface of the substrate W can be improved.

Further, since the inert gas is supplied to above the substrate W in parallel with the supply of the organic solvent to the upper surface of the substrate W, a gas flow of the inert gas flowing along an upper surface of the liquid film 120 of the organic solvent on the upper surface of the substrate W is formed. The humidity of the space SP on the upper surface of the substrate W can be kept low by this gas flow of the inert gas. Thus, the organic solvent supplied to the substrate W can be suppressed or prevented from blending into moisture in atmosphere of the space SP, whereby decrease of the liquid amount of the organic solvent supplied to the upper surface of the substrate W can be effectively suppressed or prevented, and thus, the replacement performance to the organic solvent on the upper surface of the substrate W can be further improved.

Further, in the liquid drop discharging step T2, a continuous flow of the organic solvent from the second organic solvent nozzle 44 is discharged to the upper surface of the substrate W in parallel with spouting of liquid drops of the organic solvent from the first organic solvent nozzle 27. A discharge flow rate of the organic solvent from the second organic solvent nozzle 44 is kept at about 0.3 (litter/minute), for example. Thus, in the liquid drop discharging step T2, the liquid film 120 of the organic solvent covering the entire area of the upper surface of the substrate W can be held on this upper surface. Thus, the upper surface of the substrate W can be prevented from being exposed from the liquid film 120 in the liquid drop discharging step T2, whereby liquid drops of the organic solvent can be further prevented from directly colliding the upper surface of the substrate W in a dry state.

Further, prior to the supply of liquid drops of the organic solvent to the upper surface of the substrate W, the continuous flow of the organic solvent (cover IPA discharge) to the upper surface of the substrate W is supplied to form the liquid film 120 of the organic solvent covering the entire area of the upper surface on the upper surface of the substrate W by the supply of this continuous flow. Thus, liquid drops of the organic solvent discharged toward the upper surface peripheral edge portion of the substrate W in the liquid drop discharging step T2 collides the liquid film 120 of the organic solvent covering the supply region DA at start of discharging of liquid drops of the organic solvent. That is, at the start of discharging of liquid drops of the organic solvent, liquid drops of the organic solvent can be prevented from directly colliding the upper surface of the substrate W in a dry state.

Further, also in the liquid drop discharging step T2, discharging of the temperature adjusting liquid to the lower surface of the substrate W is continued. Thus, the liquid drop discharging step T2 can be executed while the liquid film 120 of the organic solvent on the substrate W is warmed. Thus, the replacement performance to the organic solvent can be increased.

After a predetermined period (for example, about 61 seconds) has passed from the start of the liquid drop discharging step T2, the liquid drop discharging step T2 is finished. Specifically, the controller 3 opens the first organic solvent valve 32 and the gas valve 34 while keeping the rotation of the substrate W at the organic solvent treatment speed (for example, about 300 rpm) and keeping the second organic solvent valve 48, the inert gas valve 51 and the temperature adjusting liquid valve 68 at the open states. Further, prior to the start of the liquid drop discharging step T2, the controller 3 controls the first nozzle moving unit 29 to move the first organic solvent nozzle 27 from the treatment position (above the upper surface peripheral edge portion of the substrate W) to the home position laterally of the spin chuck 5. Then the second liquid film forming step T3 (see FIG. 15D) is started.

The second liquid film forming step T3 (see FIG. 15D) forms the liquid film 120 of the organic solvent covering the entire area of the upper surface of the substrate W on this upper surface continuously from the liquid drop discharging step T2 by supplying a continuous flow of the organic solvent to the upper surface center portion of the substrate W.

Similarly to the first liquid film forming step T1, in the second liquid film forming step T3, the continuous flow of the organic solvent is discharged only from the second organic solvent nozzle 44 of the common nozzle CN disposed at a stationary state (cover IPA discharge), and the organic solvent is not discharged from the first organic solvent nozzle 27. The continuous flow of the organic solvent discharged from the second organic solvent nozzle 44 contacts the upper surface center portion of the substrate W to spread toward an upper surface outer periphery of the substrate W.

In the second liquid film forming step T3, a discharge flow rate of the organic solvent from the second organic solvent nozzle 44 is set to about 0.3 (litter/minute), for example. Further, the rotation speed of the substrate W is kept at the organic solvent treatment speed (for example, about 300 rpm).

Further, also in the second liquid film forming step T3 (see FIG. 15D), discharging of the temperature adjusting liquid to the lower surface of the substrate W is continued. Thus, the second liquid film forming step T3 can be performed while the liquid film of the organic solvent on the substrate W is being warmed. Thus, the replacement performance to the organic solvent can be increased.

After a predetermined period (for example, about 10.0 seconds) has passed from stop of discharging of liquid drops of the organic solvent from the first organic solvent nozzle 27, the controller 3 stops discharging of the organic solvent to the upper surface of the substrate W by closing the first organic solvent valve 32. This finishes the second liquid film forming step T3. At this time, the temperature adjusting liquid valve 68 and the inert gas valve 51 remain opened. Then the spin drying step (S5) is started.

Figure 15E:
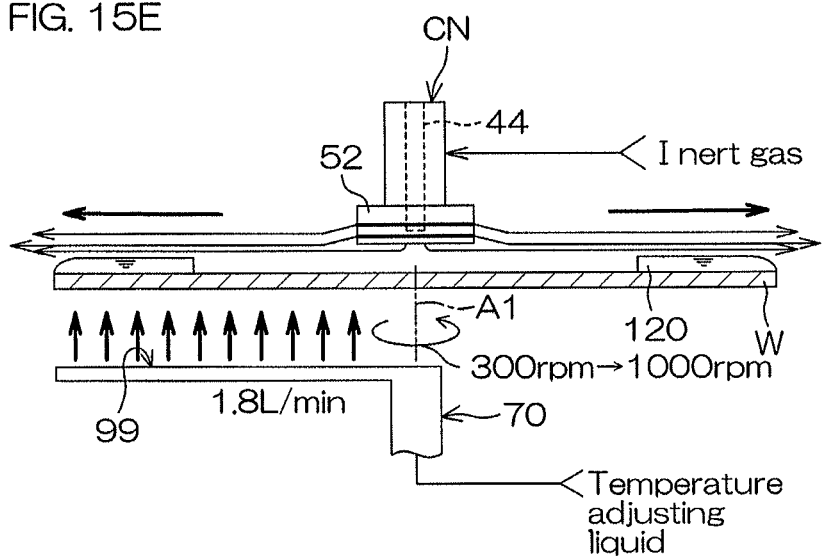
FIG. 15E to is an illustrative sectional view for describing an appearance of a first spin drying step.
Figure 15F:
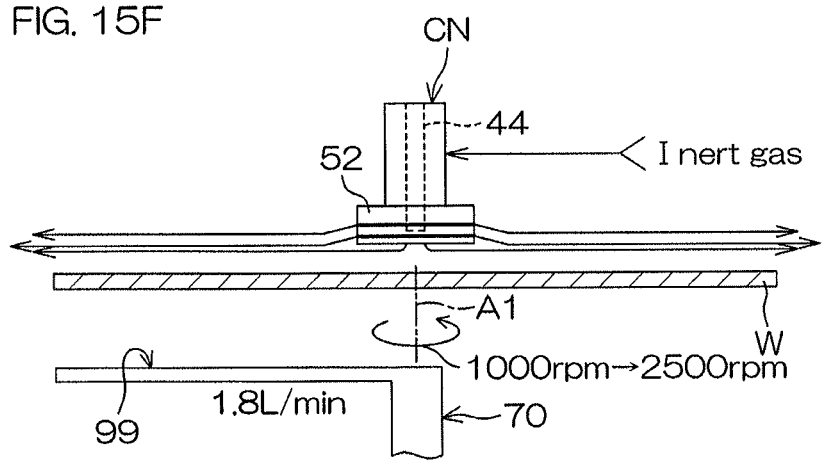
FIG. 15F is an illustrative sectional view for describing an appearance of a second spin drying step.

In this embodiment, the spin drying step (S5) includes a first spin drying step T4 (see FIG. 15E) and a second spin drying step T5 (see FIG. 15F). The replacing step (S4) is described referring to FIGS. 2, 12, 13, and 14. FIGS. 15E and 15F are referred according to need.

The first spin drying step T4 increases the rotation speed of the substrate W to a predetermined first drying speed (for example, about 1000 rpm) prior to start of the second spin drying step T5. The controller 3 controls the spin motor 17 to increase the rotation speed of the substrate W from the organic solvent treatment speed (for example, about 300 rpm) to the first drying speed, as shown in FIG. 15E. When the rotation speed of the substrate W reaches the first drying speed, it is kept at this first drying speed.

Continuously from the replacing step (S4), in the spin drying step (S5), the inert gas is discharged from the three gas discharging ports (the upper gas discharging port 55 (see FIG. 4), the lower gas discharging port 56 (see FIG. 4) and the center gas discharging port 57 (see FIG. 4)) from the inert gas nozzle 52 (common nozzle CN). Discharge flow rates of the inert gas from the upper gas discharging port 55, the lower gas discharging port 56 and the center gas discharging port 57 at this time are equal to those in the replacing step (S4).

Further, continuously from the replacing step (S4), discharging of the temperature adjusting liquid to the lower surface of the substrate W is continued in the first spin drying step T4. In the first spin drying step T4, a liquid of the organic solvent is scattered from the upper surface of the substrate W to a vicinity in a course of acceleration of the rotation of the substrate W.

When a predetermined timing comes after the rotation speed of the substrate W reaches the first drying speed, the controller 3 closes the temperature adjusting liquid valve 78 to stop discharging of the temperature adjusting liquid to the lower surface of the substrate W. Thus, the first spin drying step T4 is finished, and the second spin drying step T5 is continuously started. Thereafter, the controller 3 controls the spin motor 17 to keep the rotation of the substrate W at the predetermined first drying speed (for example, about 1000 rpm).

After a predetermined period (for example, 10 seconds) has passed from the stop of discharging of the temperature adjusting liquid to the lower surface of the substrate W (start of the second spin drying step T5), the controller 3 controls the spin motor 17 to increase the rotation speed of the substrate W to a predetermined second drying speed (for example, about 2500 rpm) as shown in FIG. 15F. Thus, the organic solvent on the substrate W is further flicked off, and the substrate W is being dried.

When a predetermined period (for example, 10 seconds) has passed after the rotation speed of the substrate W is accelerated to the predetermined second drying speed, the controller 3 controls the spin motor 17 to stop rotation of the spin chuck 5. Further, after stopping the rotation of the substrate W by the spin chuck 5, the controller 3 closes the inert gas valve 51 to stop the discharging of gas from the three gas discharging ports 55, 56, 57 and, at the same time, controls the second nozzle moving unit 46 to retract the common nozzle CN to the home position. Thereafter, the substrate W is brought out from the processing chamber 4.

As described above, according to this embodiment, in the replacing step (S4), discharging of the organic solvent from the first organic solvent nozzle 27 to the upper surface center portion of the substrate W, discharging of the organic solvent from the second organic solvent nozzle 44 to the upper surface peripheral edge portion of the substrate W, and supply of the inert gas to above the substrate W are executed in parallel with one another.

Since discharging of the organic solvent to the upper surface peripheral edge portion of the substrate W is executed in parallel with discharging of the organic solvent to the upper surface center portion of the substrate W, a sufficient amount of the organic solvent can be allowed to reach not only the upper surface center portion of the substrate W but also the upper surface peripheral edge portion of the substrate W.

Further, the inert gas is supplied to above the substrate W in parallel with supply of the organic solvent to the upper surface of the substrate W, whereby the gas flow of the inert gas flowing along the upper surface of the liquid film 120 of the organic solvent on the upper surface of the substrate W is formed. The humidity of the space SP on the upper surface of the substrate W can be kept low by this gas flow of the inert gas. Assuming that the organic solvent is supplied to the upper surface of the substrate W in a state where the humidity of the space SP on the upper surface of the substrate W is high, the organic solvent supplied to the upper surface of the substrate W may blend into moisture contained in atmosphere of the space SP, thus an amount of the organic solvent present on the upper surface of the substrate W may be decreased, and as a result, the replacement performance to the organic solvent may be lowered.

Contrary to this, in the present embodiment, the organic solvent supplied to the substrate W can be suppressed or prevented from blending into moisture in atmosphere of the space SP by keeping low the humidity of the space SP in the replacing step (S4). Thus, decrease of a liquid amount of the organic solvent supplied to the upper surface of the substrate W can be effectively suppressed or prevented.

Accordingly, since a sufficient liquid amount of the organic solvent can be supplied to the upper surface peripheral edge portion of the substrate W, and at the same time, decrease of the organic solvent supplied to the upper surface peripheral edge portion of the substrate W can be effectively suppressed or prevented, the replacement performance to the organic solvent on the upper surface peripheral edge portion of the substrate W can be tried to increased. Thus, a collapse of a pattern on the upper surface peripheral edge portion of the substrate W can be more effectively suppressed.

In this embodiment, the inert gas nozzle 52 (common nozzle CN) is disposed above the upper surface center portion of the substrate W, and distances from the discharging ports 55, 56, 57 to a peripheral edge of the substrate W are large. Thus, the inert gas from the inert gas nozzle 52 (common nozzle CN) may not sufficiently reach the upper surface peripheral edge portion of the substrate W, and as a result, there may be a problem that the humidity above the upper surface peripheral edge portion of the substrate W cannot be kept low. In this case, a replacement efficiency to the organic solvent may be insufficient.

However, in this embodiment, the organic solvent supplied to the upper surface peripheral edge portion of the substrate W is liquid drops of the organic solvent. Thus, a physical force is applied to the supply region DA of liquid drops of the organic solvent on the upper surface peripheral edge portion of the substrate W by collision of liquid drops of the organic solvent. Thus, the replacement performance to the organic solvent on the upper surface peripheral edge portion of the substrate W can be tried to be further increased.

Further, the inert gas is supplied to above the substrate W in parallel with supply of the organic solvent to the upper surface center portion of the substrate W, whereby the upper surface of the substrate W can be made in a dried state after the replacing step (S4) is finished, that is, before the spin drying step (S5) is started. Thus, after the spin drying step (S5) is finished, the substrate W can be made more reliably in a dried state.

Further, in the liquid drop discharging step T2, the supply region DA of liquid drops of the organic solvent on the upper surface of the substrate W is moved on the upper surface peripheral edge portion. Thus, liquid drops of the organic solvent spouted from the second organic solvent nozzle 44 can be extensively supplied to the upper surface peripheral edge portion of the substrate W. Thus, the replacement performance to the organic solvent can be increased on an extensive area of the upper surface peripheral edge portion of the substrate W.

Further, if the first organic solvent nozzle 27 is disposed near the upper surface of the substrate W similarly to the inert gas nozzle 52, a body of the first organic solvent nozzle 27 may interfere with a radial gas flow of the inert gas to disturb this gas flow. In this case, the humidity above the upper surface peripheral edge portion of the substrate W cannot be kept low, and as a result, there may be a problem that the replacement efficiency to the organic solvent is decreased on the upper surface peripheral edge portion of the substrate W.

In this embodiment, the second organic solvent nozzle 44 is disposed above the radial gas flow of the inert gas. Thus, it can be suppressed or prevented that the second organic solvent nozzle 44 disturbs the radial gas flow of the inert gas. As a result, the inert gas can reliably cover above the peripheral edge portion of the substrate W. Thus, a humidity of an atmosphere above the peripheral edge portion of the substrate W can be further lower.

Further, continuously from finish of the second liquid film forming step T3 of supplying the organic solvent to the upper surface of the substrate W, the spin drying step (S5) of rotating the substrate W in a flicking-off manner with the inert gas being supplied to above the substrate W. Therefore, if the second organic solvent nozzle 44 discharging an organic solvent for cover is provided separately from the inert gas nozzle 52, a task of replacing a nozzle disposed above a substrate W from the second organic solvent nozzle 44 to the inert gas nozzle 52 is required prior to the spin drying step (S5) after the second liquid film forming step T3, and time is needed for this replacing task. In this case, an entire processing time may increase, and a throughput may be deteriorated. Further, when a nozzle replacing task is executed, its time loss may lower a temperature of a substrate W.

Contrary to this, in this embodiment, since the second organic solvent nozzle 44 and the inert gas nozzle 52 are integrally provided, there is not a need to replacing nozzles prior to the spin drying step (S5) after the second liquid film forming step T3. Thus, a nozzle replacing task is not needed, and an entire processing time can be shortened. Thus, a throughput can be tried to be increased, and at the same time, a temperature decrease of a substrate W because of the nozzle replacing task before the spin drying step (S5) is started can be suppressed.

Figure 16:
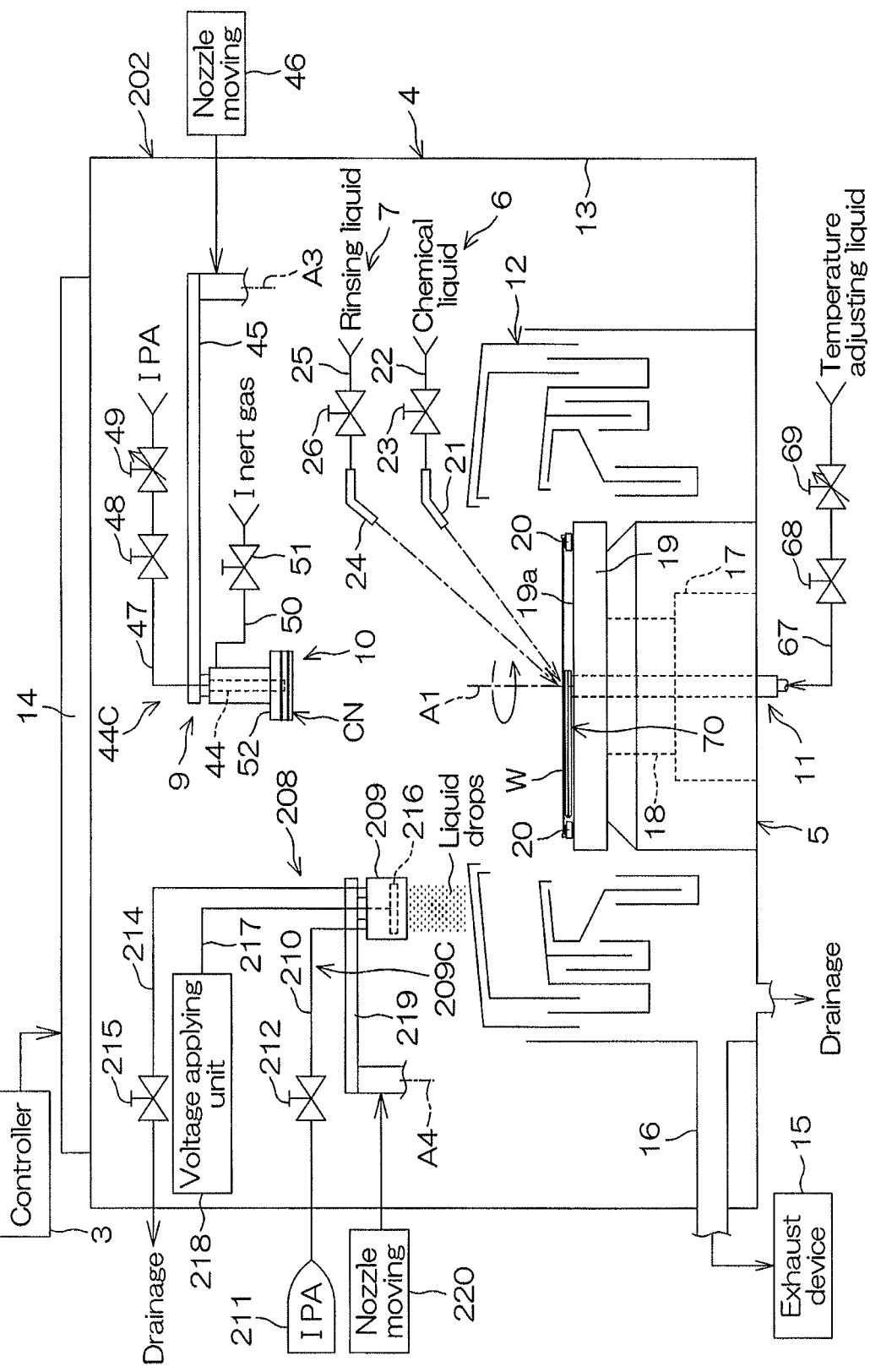
FIG. 16 is an illustrative sectional view for describing a configuration example of a processing unit according to another embodiment of the invention.
Figure 17A:
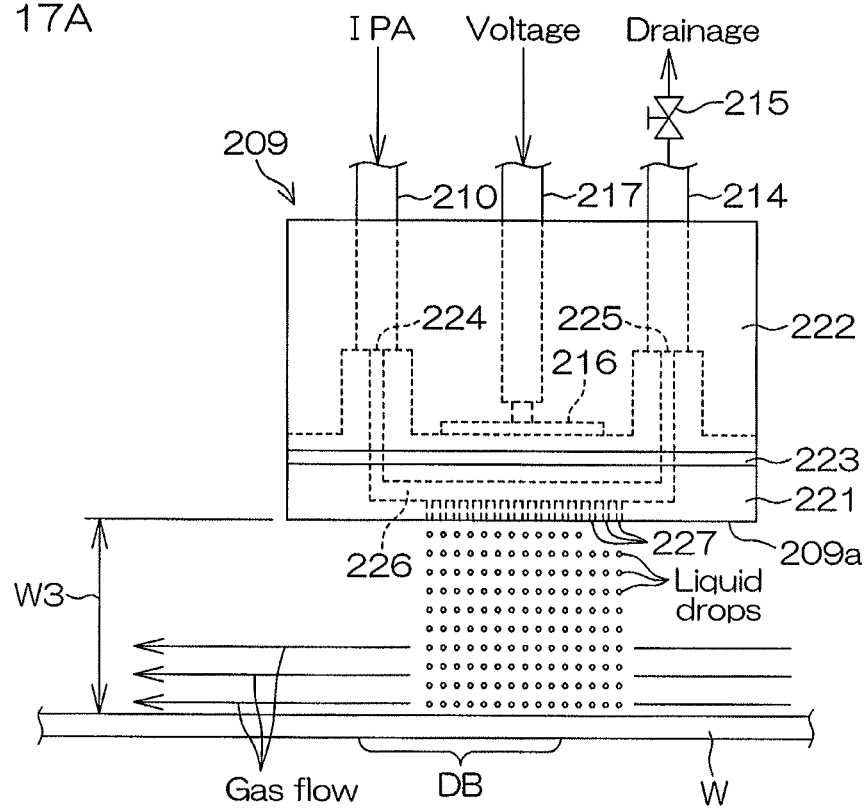
FIG. 17A is a sectional view illustratively showing a configuration of a liquid drop nozzle included in the processing unit.
Figure 17B:
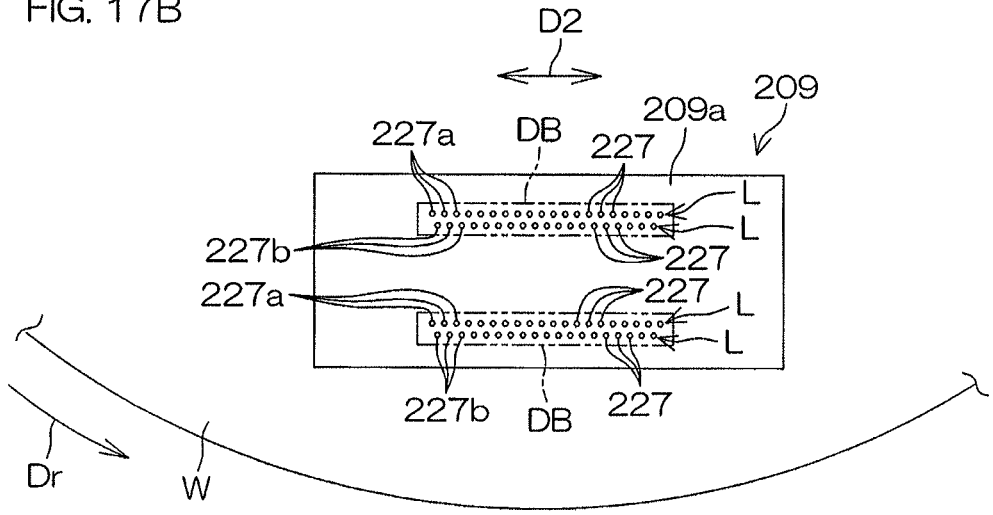
FIG. 17B is a schematic plan view of the liquid drop nozzle.
Figure 18:
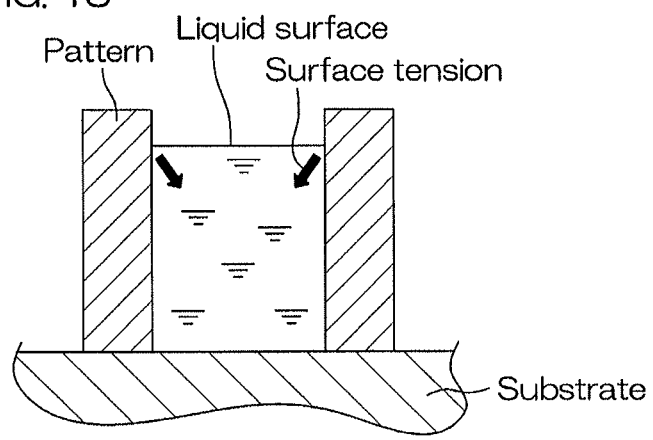
FIG. 18 is an illustrative sectional view for describing a principle of pattern collapse by a surface tension.

FIG. 16 is an illustrative sectional view for describing a configuration example of a processing unit 202 according to another embodiment of the invention. FIG. 17A is a sectional view illustratively showing a configuration of a liquid drop nozzle 209 (first low-surface-tension liquid nozzle) included in the processing unit 202. FIG. 17B is a schematic plan view of the liquid drop nozzle 209. In FIG. 17B, a lower surface 209*a* of the liquid drop nozzle 209 is only shown. In FIGS. 16 to 17B, portions corresponding to the respective portions shown in the above-described embodiment have the same reference symbols as in above-described FIGS. 1 to 15F, and their descriptions are omitted.

The processing unit 202 according to FIGS. 16 to 17B is different from the processing unit 2 according to above-described FIGS. 1 to 15F in that the processing unit 202 comprises a third organic solvent supplying unit 208 in place of the first organic solvent supplying unit 8.

The third organic solvent supplying unit 208 is configured from an ink-jet nozzle spouting many of liquid drops by an ink-jet method. A third organic solvent supplying mechanism (first low-surface-tension liquid supplying mechanism) 209C supplying the organic solvent to the liquid drop nozzle 209 is connected to the liquid drop nozzle 209. The third organic solvent nozzle 209C is connected to organic solvent line 210 connected to the liquid drop nozzle 209 and an organic solvent supply source 211 connected to the organic solvent line 210. A third organic solvent valve 212 is interposed in the organic solvent line 210. Further, the liquid drop nozzle 209 is connected to drainage line 214 in which a draining valve 215 is interposed. The organic solvent supply source 211 includes a pump, for example. The organic solvent supply source 211 supplies the organic solvent to the liquid drop nozzle 209 at a predetermined pressure (for example, 10 MPa or less). The controller 3 can change a pressure of the organic solvent supplied to the liquid drop nozzle 209 to an arbitrary pressure by controlling the organic solvent supply source 211.

Further, as shown in FIG. 16, the liquid drop nozzle 209 includes a piezo element 216 disposed in an inside of the liquid drop nozzle 209. The piezo element 216 is connected to a voltage applying unit 218 via wiring 217. The voltage applying unit 218 includes an inverter, for example. The voltage applying unit 218 applies an alternating voltage to the piezo element 216. When an alternating voltage is applied to the piezo element 216, the piezo element 216 vibrates at a frequency corresponding to a frequency of the applied alternating voltage. The controller 3 can change the frequency of the alternating voltage applied to the piezo element 216 to an arbitrary voltage (for example, several hundreds KHz to several MHz) by controlling the voltage applying unit 218. Therefore, a frequency of vibration of the piezo element 216 is controlled by the controller 3.

The processing unit 202 includes a third nozzle arm 219 holding the liquid drop nozzle 209 at a tip end. A third nozzle moving unit 220 includes a motor and a ball screw, for example. The third nozzle moving unit 220 swings the third nozzle arm 219 about a vertical third swinging axis line A4 provided around the spin chuck 5 and, at the same time, moves the third nozzle arm 219 up and down in the vertical direction. Thus, the liquid drop nozzle 209 moves in the horizontal direction and also in the vertical direction.

The third nozzle moving unit 220 moves horizontally the liquid drop nozzle 209 within a horizontal plane including above the spin chuck 5. The third nozzle moving unit 220 moves horizontally the liquid drop nozzle 209 along an arc-shaped trajectory (trajectory equal to the trajectory X1 (see FIG. 5)) extending along the upper surface of the substrate W held by the spin chuck 5 and passing the center of the upper surface of the substrate W (for example, on the rotation axis line A1). When the third nozzle moving unit 220 moves down the liquid drop nozzle 209 in a state where the liquid drop nozzle 209 is disposed above the substrate W held by the spin chuck 5, the liquid drop nozzle 209 comes near the upper surface of the substrate W. When liquid drops are made to be collided to the substrate W, the liquid drop nozzle 209 is moved horizontally along the above-described trajectory by making the controller 3 control the third nozzle moving unit 220 in the state where the liquid drop nozzle 209 comes near the upper surface of the substrate.

As shown in FIG. 17A, the liquid drop nozzle 209 includes a body 221 spouting liquid drops of the organic solvent, a cover 222 covering the body 221, the piezo element 216 covered by the cover 222, and a seal 223 intervening between the body 221 and the cover 222. Both of the body 221 and the cover 222 are formed by a material having a chemical resistance. The body 221 is formed by quartz, for example. The cover 222 is formed by quartz, for example. The seal 223 is formed by an elastic material such as EPDM (ethylene propylene diene rubber), for example. The body 221 has a pressure resistance. Part of the body 221 and the piezo element 216 are accommodated in an inside of the cover 222. An end portion of the wiring 217 is connected to the piezo element 216 in the inside of the cover 222 by a solder, for example. The inside of the cover 222 is sealed off by the seal 223.

As shown in FIG. 17A, the body 221 includes a supplying port 224 to which the organic solvent is supplied, a draining port 225 draining the organic solvent supplied to the supplying port 224, an organic solvent circulation path 226 connecting the supplying port 224 and the draining port 225, and a plurality of spouting ports 227 connected to the organic solvent circulation path 226. The organic solvent circulation path 226 is provided in an inside of the body 221. The supplying port 224, the draining port 225 and the spouting ports 227 are opened on a surface of the body 221. The supplying port 224 and the draining port 225 are disposed higher than the spouting ports 227. A lower surface 209a of the body 221 is, for example, a horizontal flat surface, and the spouting ports 227 are opened on the lower surface 209a of the liquid drop nozzle 209. The spouting port 227 is a minute pore having a diameter of several μm to several dozen μm, for example. The organic solvent line 210 and the drainage line 214 are respectively connected to the supplying port 224 and the draining port 225.

As shown in FIG. 17B, the plurality of spouting ports 227 configure a plurality (four, for example, in FIG. 17B) of lines L. Each line L is configured by many (10 or more, for example) of spouting ports 227 arranged at regular intervals. Each line L extends linearly along a horizontal longitudinal direction D2. Each line L is not limited to a linear shape but may have a curved shape. Four lines L are parallel to one another. Two lines L out of the four lines L are adjacent in the horizontal direction orthogonal to the longitudinal direction D2. Similarly, remaining two lines L are also adjacent in the horizontal direction orthogonal to the longitudinal direction D2. The adjacent two lines L form a pair. In the pair of the two lines L, a plurality of spouting ports 227 forming one line L (spouting ports 227a in FIG. 17B) and a plurality of spouting ports 227 forming the other line L (spouting ports 227b in FIG. 17B) are misaligned in the longitudinal direction D2. The liquid drop nozzle 209 is held by the third nozzle arm 219 (see FIG. 16) such that the four lines L intersect a trajectory (trajectory equal to the trajectory X1 (see FIG. 5)).

The organic solvent supply source 211 (see FIG. 17A) always supplies the organic solvent to the liquid drop nozzle 209 at a high pressure. The organic solvent supplied from the organic solvent supply source 211 to the supplying port 224 via the organic solvent line 210 is supplied to the organic solvent circulation path 226. A pressure (liquid pressure) of the organic solvent in the organic solvent circulation path 226 is high in a state where the draining valve 215 is closed. Thus, in the state where the draining valve 215 is closed, the organic solvent is spouted from each spouting port 227 by the liquid pressure. Further, when an alternating voltage is applied to the piezo element 216 in the state where the draining valve 215 is closed, vibration of the piezo element 216 is applied to the organic solvent flowing in the organic solvent circulation path 226, the organic solvent spouted from each spouting port 227 is segmentalized by this vibration. Thus, when the alternating voltage is applied to the piezo element 216 in the state where the draining valve 215 is closed, liquid drops of the organic solvent is spouted from each spouting port 227. Accordingly, many liquid drops of the organic solvent having an even particle diameter are simultaneously spouted at a regular speed.

On the other hand, the organic solvent supplied to the organic solvent circulation path 226 is drained from the draining port 225 to the drainage line 214 in a state where the draining valve 215 is opened. That is, since a liquid pressure in the organic solvent circulation path 226 does not sufficiently increase in the state where the draining valve 215 is opened, the organic solvent supplied to the organic solvent circulation path 226 is not spouted from the spouting port 227 as a minute pore but is drained from the draining port 225 to the drainage line 214. Therefore, discharging of the organic solvent from the spouting port 227 is controlled by opening and closing of the draining valve 215. While not using the liquid drop nozzle 209 for a treatment of a substrate W (during standby of the liquid drop nozzle 209), the controller 3 opens the draining valve 215. Thus, even when the liquid drop nozzle 209 is on standby, a state where the organic solvent circulates in the inside of the liquid drop nozzle 209 is maintained.

Motion of the third nozzle moving unit 220 is controlled by the controller 3. Further, the controller 3 controls opening and closing and the like of the first mixed liquid line 212 and the draining valve 215.

In the embodiment of FIGS. 16 to 17B, processing equally to the substrate processing shown in FIGS. 13 and 14 is executed. However, processing described below is executed with respect to the liquid drop discharging step T2 of the replacing step (S4).

Prior to the liquid drop discharging step T2, the controller 3 controls the third nozzle moving unit 220 to move the liquid drop nozzle 209 from a home position set laterally of the spin chuck 5 to a treatment position (above the upper surface peripheral edge portion of the substrate W). In a state where the liquid drop nozzle 209 is disposed at the treatment position, a distance W3 (>W1; see FIG. 17A) between a lower end of the liquid drop nozzle 209 and the upper surface of the substrate W is 20 mm, for example. A disposed position of the liquid drop nozzle 209 is higher than the radial gas flow of the inert gas formed above the substrate W.

When a start timing of the liquid drop discharging step T2 comes, the controller 3 closes the draining valve 215 while keeping the rotation of the substrate W at the organic solvent treatment speed (for example, about 300 rpm) and keeping the second organic solvent valve 48 and the temperature adjusting liquid valve 68 at open states thereby increasing a pressure of the organic solvent circulation path 226, and at the same time, vibrates the organic solvent in the organic solvent circulation path 226 by driving the piezo element 216. Accordingly, many liquid drops of the organic solvent having an even particle diameter are simultaneously spouted at a regular speed from each spouting port 227 of the liquid drop nozzle 209.

As shown in FIG. 17B, the many liquid drops spouted from the liquid drop nozzle 209 are blown to two supply regions DB within the upper surface of the substrate W. That is, one supply region DB is a region directly below two lines L of one pair, and liquid drops of the organic solvent spouted from the spouting ports 227 configuring these two lines L are blown to the one supply region DB. Similarly, the other supply region DB is a region directly below two lines L of the other pair, and liquid drops of the organic solvent spouted from the spouting ports 227 configuring these two lines L are blown to the other supply region DB. As shown in FIG. 17B, each supply region DB has a rectangular shape in plan view extending in the longitudinal direction D2, and the two supply regions DB are parallel.

Further, in the liquid drop discharging step T2, the controller 3 controls the third nozzle moving unit 220 to reciprocate horizontally the liquid drop nozzle 209 between a first peripheral edge position (position equal to the position shown by the two-dot chain line in FIG. 5) and a second peripheral edge position (position equal to the position shown by the chain line in FIG. 5) along the trajectory X1 (trajectory equal to that in FIG. 5). Thus, the supply region DB scans extensively the entire area of the upper surface peripheral edge portion of the substrate W. Consequently, liquid drops of the organic solvent spouted from the liquid drop nozzle 209 can be supplied to an extensive area of the upper surface peripheral edge portion of the substrate W.

After a predetermined period has passed from start of the liquid drop discharging step T2, the liquid drop discharging step T2 is finished.

The embodiment of FIGS. 16 to 17B achieves operational advantages equal to operational advantages described in the above-described embodiment of FIGS. 1 to 15F.

Additionally, since gas is not blown to the upper surface of the substrate W in the liquid drop discharging step (S6), disturbance of the gas flow of the inert gas flowing along the upper surface of the substrate W can be suppressed or prevented when liquid drops of the organic solvent are supplied to the upper surface of the substrate W. As a result, the inert gas can reliably cover above the peripheral edge portion of the substrate W. Thus, the humidity of the atmosphere above the peripheral edge portion of the substrate W can be kept further lower.

While the two embodiments of the invention have been described, the invention may be implemented in other modes.

For example, in the first embodiment, while a two-fluid nozzle of an external mixing type producing liquid drops by colliding gas and a liquid in an outside of a nozzle body (outer cylinder 36 (see FIG. 3)) to mix them is described illustratively as the first organic solvent nozzle 27, a two-fluid nozzle of an internal mixing type producing liquid drops by mixing gas and a liquid in an inside of a nozzle body may be employed as the first organic solvent nozzle 27.

Further, in each of the above-described embodiments, it is described that in the liquid drop discharging step T2, the common nozzle CN comes nearer the upper surface of the substrate W than the first organic solvent nozzle 27 (liquid drop nozzle 209). However, the lower surface of the common nozzle CN and a lower surface of the first organic solvent nozzle 27 (liquid drop nozzle 209) may be disposed at positions similar to each other.

Further, in the liquid drop discharging step T2 of each embodiment, it is also possible that the supply region DA (see FIG. 15C) and the supply region DB (see FIG. 17B) are not scanned but are made to come to rest on the upper surface peripheral edge portion of the substrate W. In this case, the first organic solvent nozzle 27 (liquid drop nozzle 209) and the second organic solvent nozzle 44 may employ a mode of fixed nozzle which does not scan a supply region.

Further, while it is described that the replacing step (S4) includes the first liquid film forming step T1, the liquid drop discharging step T2, and the second liquid film forming step T3, if at least the liquid drop discharging step T2 is included, the other two steps can be omitted.

Further, while it is described that the inert gas nozzle 52 includes the three gas discharging ports 55, 56, 57, it is possible that the inert gas nozzle 52 includes not all the three gas discharging ports 55, 56, 57 but at least one gas discharging port.

Further, while it is described that the lower surface nozzle 70 comprises only one nozzle portion 73, the lower surface nozzle 70 may comprise two or more nozzle portions 73. Further, while it is described that the lower surface nozzle 70 is a bar nozzle comprising the nozzle portion 73, the lower surface nozzle may have a configuration not comprising the nozzle portion 73 (for example, center axis nozzle). Further, the lower surface nozzle 70 may be removed. That is, supply of a temperature adjusting fluid to the substrate W may be omitted.

Further, in each of the above-described embodiments, not liquid drops of the organic solvent but a continuous flow of the organic solvent may be supplied to the peripheral edge portion of the substrate W in the replacing step (S4). In this case, it is possible that the configuration of the first organic solvent nozzle 27 comprising a two-fluid nozzle and the configuration of the liquid drop nozzle 209 may be removed, and as a result, cost-cutting can be achieved. Further, in each of the above-described embodiments, the second organic solvent nozzle 44 discharging the organic solvent for cover may be provided separately from the inert gas nozzle 52 (movably with respect to the inert gas nozzle 52).

Further, an organic solvent used in the present invention (organic solvent having a surface tension lower than that of a rinsing liquid and having a boiling point lower than that of the rinsing liquid) is not limited to IPA. An organic solvent includes at least one of IPA, methanol, ethanol, HFE (hydro fluoro ether), acetone, and Trans-1,2-Dichloroethylene. Further, an organic solvent is not limited to one having only a single constituent but may be a liquid mixed with other constituent. For example, an organic solvent may be a mixture of IPA and acetone and may be a mixture of IPA and methanol.

Further, in the above-described embodiments, while a case where the substrate processing apparatus 1 is an apparatus processing disk-shaped substrates is described, the substrate processing apparatus 1 may be an apparatus processing polygonal substrates such as glass substrate for a liquid crystal display device.

While the embodiments of the present invention are described in detail, these are only specific examples used for clarifying technical contents of the present invention, and the present invention should not be construed as being limited to these specific examples, and the scope of the present invention is only limited by the appended claims.

This application corresponds to Japanese Patent Application No. 2015-192156 filed in Japan Patent Office on Sep. 29, 2015, the entire disclosure of which is incorporated herein by reference.

LIST OF REFERENCE NUMERALS

1 substrate processing apparatus
2 processing unit
3 controller
5 spin chuck (substrate holding unit)
10 inert gas supplying unit
27 first organic solvent nozzle (first low-surface-tension liquid nozzle)
27A first organic solvent supplying mechanism (first low-surface-tension liquid supplying mechanism)
44 second organic solvent nozzle (second low-surface-tension liquid nozzle)
44C second organic solvent supplying mechanism (second low-surface-tension liquid supplying mechanism)
52 inert gas nozzle
202 processing unit
209 liquid drop nozzle (first low-surface-tension liquid nozzle)
209C third organic solvent supplying mechanism (third low-surface-tension liquid supplying mechanism)
DA supply region
DB supply region
W substrate

What is claimed is:

1. A substrate processing method of processing a substrate held horizontally by using a processing liquid, including:
   a replacing step of replacing the processing liquid adhered on an upper surface of the substrate with a low-surface-tension liquid whose surface tension is lower than that of the processing liquid, wherein
   the replacing step includes
   a first liquid film forming step of discharging the low-surface-tension liquid from a first low-surface-tension liquid nozzle disposed above the substrate toward a center portion of the upper surface of the substrate so as to form a liquid film of the low-surface-tension liquid that entirely covers the upper surface of the substrate,
   a liquid drop discharging step of discharging, in parallel with the low-surface-tension liquid discharging by the first low-surface-tension liquid nozzle, a liquid drop of the low-surface-tension liquid from a second low-surface-tension liquid nozzle disposed above the substrate toward a peripheral edge portion of the upper surface of the substrate being entirely covered with the liquid film of the low-surface-tension liquid, and
   an inert gas supplying step of supplying, in parallel with the low-surface-tension liquid discharging by the first low-surface-tension liquid nozzle and the low-surface-tension liquid drop discharging by the second low-surface-tension liquid nozzle, inert gas to above the upper surface of the substrate in order to form a gas flow flowing along the upper surface of the substrate.

2. A substrate processing method according to claim 1, wherein the liquid drop discharging step includes a step of discharging a liquid drop of the low-surface-tension liquid generated by mixing the low-surface-tension liquid and gas.

3. A substrate processing method according to claim 1, wherein the liquid drop discharging step includes a step of spouting a liquid drop of the low-surface-tension liquid from a plurality of spouting ports.

4. A substrate processing method according to claim 1, further including a supply region moving step of moving on the upper surface a supply region of the liquid drop of the low-surface-tension liquid on the peripheral edge portion of the upper surface of the substrate in parallel with the liquid drop discharging step.

5. The substrate processing method according to claim 1, wherein the replacing step further includes a second liquid film forming step of stopping the low-surface-tension liquid drop discharging from the second low-surface-tension liquid nozzle before stopping the low-surface-tension liquid supply from the first low-surface-tension liquid nozzle in the first liquid film forming step so as to form a liquid film of the low-surface-tension liquid supplied from the first low-surface-tension liquid nozzle that entirely covers the upper surface of the substrate.

6. A substrate processing apparatus for processing a substrate by using a processing liquid, including:
   a substrate holding unit that holds the substrate horizontally;
   a first low-surface-tension liquid nozzle disposed above the substrate for discharging a low-surface-tension liquid whose surface tension is lower than that of the processing liquid toward a center portion of an upper surface of the substrate;
   a first low-surface-tension liquid supplying mechanism that includes a line connected to the first low-surface-tension liquid nozzle and to a low-surface-tension liquid source, and that supplies the low-surface-tension liquid to the first low-surface-tension liquid nozzle;
   an inert gas supplying unit that supplies inert gas to above the upper surface of the substrate;
   a second low-surface-tension liquid nozzle disposed above the substrate for discharging the low-surface-tension liquid toward a peripheral edge portion of the upper surface of the substrate;
   a second low-surface-tension liquid supplying mechanism that includes a line connected to the second low-surface-tension liquid nozzle and to a low-surface-tension liquid source, and that supplies the low-surface-tension liquid to the second low-surface-tension liquid nozzle; and
   a controller, that controls the first low-surface-tension liquid supplying mechanism, the second low-surface-tension liquid supplying mechanism, and the inert gas supplying unit,
   wherein the controller is programmed to execute a replacing step of replacing the processing liquid adhered on the upper surface of the substrate with the low-surface-tension liquid, and
   the controller is programmed to execute, in the replacing step,
   a first film forming step of causing the first low-surface-tension liquid supplying mechanism to discharge the low-surface-tension liquid from the first low-surfacetension liquid nozzle toward the center portion of the upper surface of the substrate so as to form a liquid film of the low-surface-tension liquid that entirely covers the upper surface of the substrate, a liquid drop discharging step of causing the second low-surface-tension liquid supplying mechanism to discharge, in parallel with the low-surface-tension liquid discharging by the first low-surface-tension liquid nozzle, a liquid drop of the low-surface-tension liquid from the second low-surface-tension liquid nozzle disposed above the substrate toward the peripheral edge portion of the upper surface of the substrate being entirely covered with the liquid film of the low-surface-tension liquid, and an inert gas supplying step of causing the inert gas supplying unit to supply, in parallel with the low-surface-tension liquid discharging by the first low-surface-tension liquid nozzle and the low-surface-tension liquid drop discharging by the second low-surface-tension liquid nozzle, inert gas to above the upper surface of the substrate in order to form a gas flow flowing along the upper surface of the substrate.

7. A substrate processing apparatus according to claim 6, wherein the inert gas supplying unit includes an inert gas nozzle that forms the gas flow radially spreading from the center portion of the upper surface of the substrate to the peripheral edge portion of the upper surface along the upper surface by discharging inert gas above the substrate, and the second low-surface-tension liquid nozzle is disposed above the peripheral edge portion of the substrate and above the gas flow.

8. The substrate processing apparatus according to claim 6, wherein the replacing step further includes a second liquid film forming step of stopping the low-surface-tension liquid drop discharging from the second low-surface-tension liquid nozzle before stopping the low-surface-tension liquid supply from the first low-surface-tension liquid nozzle in the first liquid film forming step so as to form a liquid film of the low-surface-tension liquid supplied from the first low-surface-tension liquid nozzle that entirely covers the upper surface of the substrate.

* * * * *